United States Patent
Sasaki et al.

(10) Patent No.: US 8,003,160 B2
(45) Date of Patent: Aug. 23, 2011

(54) WIRING SUBSTRATE

(75) Inventors: Hiroshi Sasaki, Mito (JP); Makoto Kurosawa, Tokai (JP); Kazuo Shimizu, Hitachinaka (JP)

(73) Assignee: Ricoh Printing Systems, Ltd., Hitachinaka-shi, Ibaraki (JP)

( * ) Notice: Subject to any disclaimer, the term of this patent is extended or adjusted under 35 U.S.C. 154(b) by 936 days.

(21) Appl. No.: 11/707,091

(22) Filed: Feb. 16, 2007

(65) Prior Publication Data

US 2007/0154626 A1  Jul. 5, 2007

Related U.S. Application Data

(62) Division of application No. 11/019,984, filed on Dec. 23, 2004, now abandoned.

(30) Foreign Application Priority Data

Dec. 26, 2003  (JP) ................................ 2003-431803

(51) Int. Cl.
*B05D 5/12*  (2006.01)

(52) U.S. Cl. ...................... 427/98.4; 427/98.5; 427/98.8; 427/99.2; 427/123; 427/307

(58) Field of Classification Search ................. 427/98.4, 427/98.5, 98.8, 99.2, 123, 307
See application file for complete search history.

(56) References Cited

U.S. PATENT DOCUMENTS

| | | | | |
|---|---|---|---|---|
| 4,528,064 | A | * | 7/1985 | Ohsawa et al. ................... 216/18 |
| 5,055,342 | A | * | 10/1991 | Markovich et al. ............ 428/137 |
| 5,157,066 | A | * | 10/1992 | Shoji et al. ..................... 524/220 |
| 6,027,852 | A | * | 2/2000 | Sasaki et al. ............... 430/270.1 |
| 2003/0139620 | A1 | | 7/2003 | Yamaguchi |
| 2004/0137159 | A1 | * | 7/2004 | Nakamura et al. ............. 427/421 |

FOREIGN PATENT DOCUMENTS

| | | |
|---|---|---|
| JP | 11-274371 | 10/1999 |
| JP | 2002-038094 | 2/2002 |
| JP | 2003-133692 | 5/2003 |
| JP | 2003-201571 | 7/2003 |
| JP | 2003-238577 | 8/2003 |

OTHER PUBLICATIONS

Nikkei Electronics, Jun. 17, 2002, pp. 67-78 with English translation.
Japanese Office Action of Appln. No. 2003-431803 with partial translation dated May 12, 2009.

* cited by examiner

*Primary Examiner* — Brian K Talbot
(74) *Attorney, Agent, or Firm* — Antonelli, Terry, Stout & Kraus, LLP.

(57) ABSTRACT

A substrate is provided on which wires can be formed satisfactorily using a dispersion liquid of metal microparticles without causing disconnection or short circuit. The wiring substrate comprises a substrate, an organic membrane formed on the substrate, and a metal wire formed on the organic membrane. An arithmetic mean deviation Ra of the profile of the surface of the organic membrane where the metal wire is formed is not less than 60 nm and not more than $5 \times 10^{-2}$D, where D is the width of the metal wire. The contact angle with respect to water on the surface of the organic membrane where the metal wire is formed is not less than 110°.

20 Claims, 3 Drawing Sheets

EXAMPLE OF SUBSTRATE OF INVENTION

FIG. 1 A EXAMPLE OF SUBSTRATE WITH LOW LIQUID REPELLENCY
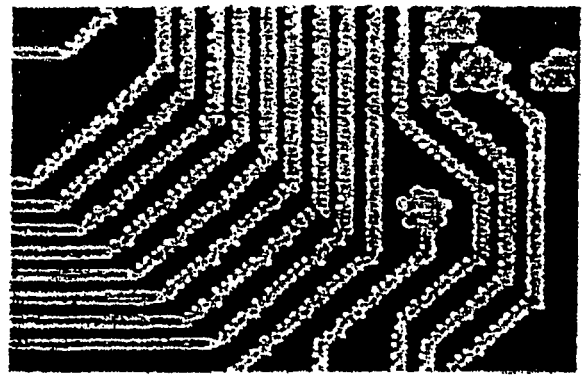
FIG. 1 B EXAMPLE OF SUBSTRATE WITH HIGH LIQUID REPELLENCY
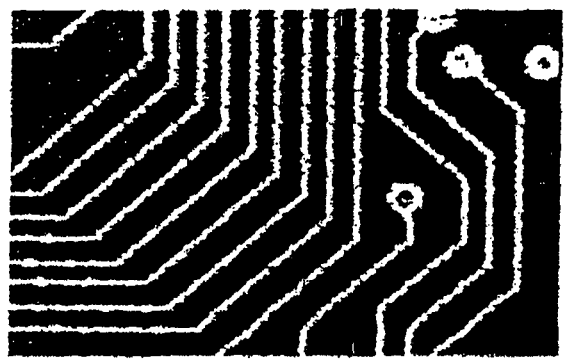
FIG. 1 C EXAMPLE OF SUBSTRATE OF INVENTION
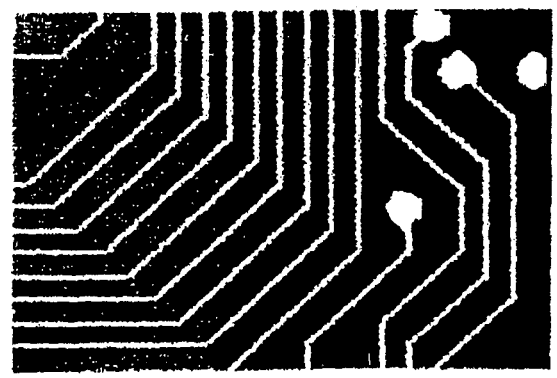

WIRING SUBSTRATE

CROSS-REFERENCE TO RELATED APPLICATION

This application is a divisional application of U.S. application Ser. No. 11/019,984, filed Dec. 23, 2004 now abandoned, the contents of which are incorporated herein by reference.

BACKGROUND OF THE INVENTION

1. Field of the Invention

The invention relates to a wiring substrate on which metal wires are formed.

2. Description of Related Art

Wiring substrates are used in many products, including OA equipment such as personal computers, printers, scanners, and various types of memory; household appliances such as television sets, audio equipment, cleaners, refrigerators, microwave ovens, and rice cookers; and transportation means such as automobiles, trains, ships, and airplanes. Metal wires are formed on such wiring substrates, and LSIs, ICs, transistors, diodes, capacitors, and resistors, for example, are mounted in accordance with the metal wires.

While the wiring substrates are in many cases formed by plating, methods have recently been disclosed whereby metal wires are formed by drawing or depicting them using a dispersion liquid of metal microparticles and then subjecting the drawn wires to heating or other processes. Examples of the relevant methods are disclosed in Patent Documents 1 to 3, whereby a substrate is coated with a dispersion liquid of metal microparticles using an ink-jet head and therefore no masks or the like are required. Since these methods enable wires to be directly drawn on the substrate using a dispersion liquid of metal microparticles, they are suitable for the manufacture of a wide variety of wiring substrates in small quantities.

Patent Document 1: JP Patent Publication (Kokai) No. 10-204350 A (1998)
Patent Document 2: JP Patent Publication (Kokai) No. 2002-134878 A
Patent Document 3: JP Patent Publication (Kokai) No. 2002-324966 A
Non-Patent Document 1: Nikkei Electronics, Jun. 17, 2002, p. 78

SUMMARY OF THE INVENTION

When drawing a wire on a substrate by coating it with a dispersion liquid of metal microparticles, if the liquid repellency of the substrate is not sufficient, the dispersion liquid of metal microparticles could spread further than is necessary, thereby failing to draw a wire of desired width. The situation is shown by way of an example in FIG. 1(a). Conversely, if the liquid repellency is too high, the droplet of the dispersion liquid that has been dropped on the substrate could be repelled, possibly resulting in a disconnection, particularly when the intended wire is a long one. This situation is shown by way of an example in FIG. 1(b). A method is conceivable whereby a wire is drawn using a dispersion of metal microparticles by adjusting the liquid repellency of the substrate with respect to the metal microparticles. However, although a desired wire can be drawn according to this method immediately after the application of the dispersion liquid to the substrate, as the dispersion medium evaporates, the surface tension of the liquid changes such that the liquid could spread further than is necessary, or be repelled by the substrate surface, resulting in a disconnection. Thus, this method would also result in the situation depicted in either FIG. 1(a) or 1(b).

In accordance with a technology disclosed in Non-Patent Document 1, (1) the surface of a substrate is rendered liquid-repellent, and then a portion where a wire is to be drawn is irradiated with a laser so as to lower the liquid repellency at the irradiated portion, followed by the formation of a wire using an ink-jet head; or (2) a groove is provided in a portion where a wire is to be drawn, and an ink-jet head is aimed at the groove to draw a wire. These techniques help alleviate the problems of the spreading of the dispersion liquid and disconnection to some extent.

However, both methods require a highly accurate processing of the portion where a wire is to be formed, and a high positioning accuracy during the drawing using the ink-jet head, which naturally call for complicated process steps. Thus, these methods still have mass-productivity problems in terms of time and cost.

It is therefore an object of the invention to provide a wiring substrate and a method of manufacturing the same whereby the undesired spreading of metal microparticles and disconnection during the formation of a metal wire using metal microparticles can be prevented and a superior mass productivity can be obtained.

As a result of analysis of the surface states of various substrates in an attempt to achieve the aforementioned object of the invention, it has been found that by using a substrate provided with appropriate surface pits and projections and with an appropriate level of liquid repellency, the spreading of metal wires to a greater degree than is desired and disconnection can be prevented.

As a first means of achieving the aforementioned object, the invention provides a wiring substrate comprising a substrate, an organic membrane formed on the substrate, and a metal wire formed on the organic membrane, wherein a mean deviation Ra of the profile of the surface of the organic membrane where the metal wire is formed is not less than 60 nm and not more than $5 \times 10^{-2}$D, where D is the width of the metal wire, and wherein the contact angle with respect to water on the surface of the organic membrane where the metal wire is formed is not less than 110°. It is experimentally presumed that this first means enables a desired metal wire pattern to be formed for the following reasons. Namely, by thus providing the organic membrane in which the metal wire is formed with an appropriate degree of liquid repellency, the excessive spreading of the dispersion liquid of metal microparticles on the organic membrane can be controlled. At the same time, by providing the surface of the organic membrane with appropriate pits and projections, the dispersion liquid of metal microparticles can permeate the pits and projections such that its liquid movement can be controlled, in an anchoring effect provided by the pits and projections.

The mean deviation Ra of profile herein refers to the arithmetic mean deviation of the profile of a surface as described in JIS B 0601 (1994). It is obviously feasible to provide another layer on the organic membrane layer. It is believed that in such cases too, where the organic membrane is not the upper-most layer on the wiring substrate, the arithmetic mean deviation Ra of profile can be similarly applied to the interface between the organic layer and the upper layer.

Preferably, the organic membrane in the above means comprises a mixture of a resin and microparticles of silicon oxide.

Preferably, the organic membrane in the above means comprises a layer of a compound including a perfluoropolyether chain or a perfluoroalkyl chain.

Preferably, the organic membrane in the above means comprises a mixture of a resin, microparticles of silicon oxide, and a fluorine-containing compound having the following structure:

Rf(R)z where Rf has the following structure:

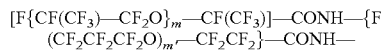

or

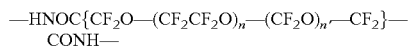

where m, m', n, and n' are natural numbers; and where R has the following structure:

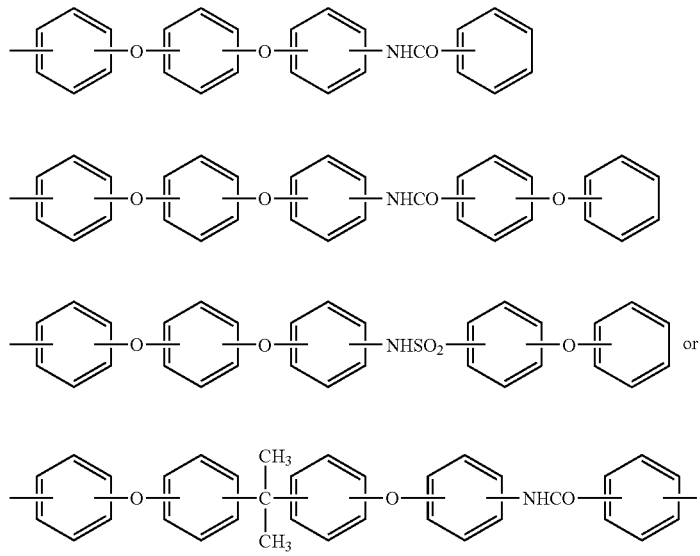

where z is 1 or 2.

Preferably, the organic membrane in the above means comprises a fluorine-containing compound chemically bonded to the surface thereof, the fluorine-containing compound having an alkoxysilane structure at the terminal thereof.

Preferably, the organic membrane in the above means comprises a fluorine-containing compound chemically bonded to the surface thereof, the fluorine-containing compound having an alkoxysilane structure of the following structure:

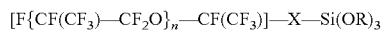

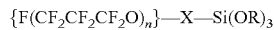

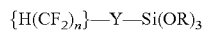

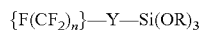

where X is a binding site of a perfluoropolyether chain and an alkoxysilane residue, Y is a binding site of a perfluoroalkyl chain and an alkoxysilane residue, and R is an alkyl group.

Preferably, the organic membrane in the aforementioned means comprises a mixture of a polyimide resin and a compound including a perfluoropolyether chain or a perfluoroalkyl chain.

As a second means to achieve the aforementioned object, the invention provides a wiring substrate comprising a substrate, and a metal wire formed on said substrate, wherein Ra is not less than 60 nm and not more than $5 \times 10^{-2}$D, where Ra an arithmetic mean deviation of the profile of said substrate and D is the width of said metal wire, and wherein the contact angle with respect to water on the surface of said substrate where said metal wire is formed is not less than 110°. In this case, by providing the substrate per se with appropriate pits and projections, a wiring substrate similar to the first means can be realized through a smaller number of process steps.

Preferably, the substrate comprises polytetrafluoroethylene.

Preferably, the substrate comprises a fluorine-containing compound chemically bonded to the surface thereof, the fluorine-containing compound having an alkoxysilane structure at the terminal thereof.

Further preferably, the substrate comprises a fluorine-containing compound chemically bonded to the surface thereof, the fluorine-containing compound including an alkoxysilane structure having the following structure:

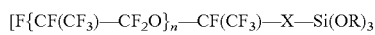

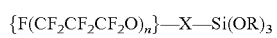

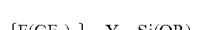

where X is a binding site of a perfluoroether chain and an alkoxysilane residue, Y is a binding site of a perfluoroalkyl chain and an alkoxysilane residue, and R is an alkyl group.

Preferably, the organic membrane in the above means comprises a mixture of a polyimide resin and a compound including a perfluoropolyether chain or a perfluoroalkyl chain.

As a third means of achieving the aforementioned object, the invention provides a method of manufacturing a wiring substrate comprising a substrate, an organic membrane formed on said substrate, and a metal wire formed on said organic membrane, said method comprising the steps of:

forming an organic membrane on a substrate;

providing said organic membrane with an arithmetic mean deviation of profile of not less than 60 nm and not more than $5 \times 10^{-2}$D, where D is the width of said metal wire, and with a contact angle with respect to water of not less than 110°;

applying a dispersion liquid containing metal microparticles to said organic membrane; and heating the dispersion liquid that has been applied.

Further, as a fourth means of achieving the aforementioned object, the invention provides a method of manufacturing a wiring substrate comprising a substrate, and a metal wire formed on said substrate, said method comprising the steps of:

providing said substrate with an arithmetic mean deviation of profile of not less than 60 nm and not more than $5 \times 10^{-2}D$, where D is the width of said metal wire, and with a contact angle with respect to water of not less than 110°;

applying a dispersion liquid containing metal microparticles to said substrate; and heating the dispersion liquid that has been applied.

In accordance with the invention, it is possible to form desired fine wires on the substrate by drawing a wire pattern on the surface thereof using a dispersion liquid of metal microparticles by an ink-jet method, for example, instead of carrying out processes such as resist layer formation, exposure, and etching. The invention can thus provide a wiring substrate that has an excellent mass productivity, and a method of manufacturing the same.

BRIEF DESCRIPTION OF THE DRAWINGS

FIG. 1 shows substrates with different liquid repellency on which wires have been formed.

DETAILED DESCRIPTION OF THE PREFERRED EMBODIMENTS

Figure 2A:
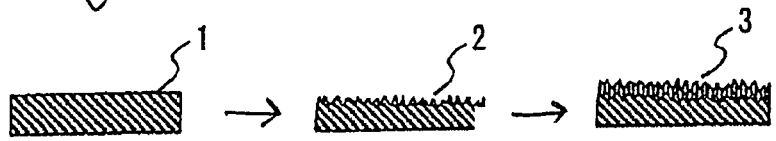
FIGS. 2A-2E schematically show methods of preparing substrate surfaces on which wires are to be formed.

While the invention is described hereafter by way of preferred embodiments thereof, it should be obvious to those skilled in the art that various changes and modifications may be made without departing from the spirit and scope of the invention.

The wiring substrate according to an embodiment is formed by the following process.

First, an organic film on which a metal wire is to be formed is prepared. This layer is provided with pits and projections with an appropriate Ra mentioned earlier, and with liquid repellency such that the contact angle with water is not less than 110°. After coating the surface of the organic film with a dispersion liquid of metal microparticles using an ink-jet head or the like, the dispersion medium is volatilized by heating while at the same time the metal microparticles are flocculated such that a metal wire is formed. By providing the wiring substrate with a multilayer structure, many metal wires can be formed within a limited area, allowing the mounting of a large number of elements (LSIs, ICs, transistors, diodes, capacitors, resistors, and so on).

Liquid repellency is required for controlling the wetting and spreading of the dispersion liquid of metal microparticles on the substrate. Examples of the dispersion medium, which occupies the largest proportion by volume of a dispersion liquid of metal microparticles, include aqueous, alcohol, and hydrocarbon media. The dispersion medium surface tension varies greatly among the various dispersion media, with water at 72 mN/m, alcohol media at 22 to 25 mN/m, and hydrocarbon media at 18 to 23 mN/m. However, the surface tension of the dispersion liquid of metal microparticles is similar among the various media due to the influence of the added dispersion agent. For example, the surface tension with water media is 29 to 38 mN/m; with alcohol media it is 27 to 35 mN/m; and with hydrocarbon media it is 25 to 35 mN/m. The inventors' analysis showed that a contact angle of 110° or larger on the substrate as measured with water can ensure that metal wires can be formed without greater-than-necessary spreading of the dispersion liquid on the substrate surface, whether the dispersion medium is aqueous, alcohol, or hydrocarbon. The upper limit of the contact angle with water is 180°.

With regard to the arithmetic mean deviation Ra of the profile of the organic film, it is desirable that Ra not be less than 60 nm and not be more than $5 \times 10^{-2}D$, where D is the width of metal wire. By observing this range, a sort of anchoring effect is thought to take place whereby the dispersion liquid of metal microparticles is trapped by the surface deviation of profile such that the movement of the liquid is prevented, thereby avoiding the splitting of a droplet and preventing disconnection. If Ra is smaller than 60 nm, the deviation of profile is too small and a sufficient anchoring effect cannot be obtained, resulting in the splitting of a droplet of the dispersion liquid of metal microparticles into several portions and causing disconnection. On the other hand, if Ra is larger than $5 \times 10^{-2}D$, the following problems would result. Namely, although the greater the height of the metal wire, the more difficult it is to break, a greater metal wire height is more likely to lead to short circuiting as the dispersion liquid of metal microparticles attaches to an adjacent metal wire, while a lower height is more likely to lead to disconnection as the dispersion liquid of metal microparticles is repelled by the large deviation of profile.

When a dispersion liquid of metal microparticles is directly discharged in a current ink-jet system, the minimum droplet has a volume on the order of 0.1 picoliter for practical purposes when taking into consideration the evaporation of the dispersion medium and the stability of the discharge amount. In this case, the diameter of the droplet is approximately 6 μm, and the minimum line width that can be drawn using such a droplet is approximately 10 μm, with an upper limit of 0.5 μm for Ra. It was also learned that, if only the deviation of profile is adjusted to be within the aforementioned range and the contact angle with water is not adjusted to be 110° or larger for liquid repellency purposes, the dispersion liquid of metal microparticles would spread on the organic film to a greater extent than necessary, leading to problems such as short circuiting.

Thus, the organic layer on which metal wires are formed should preferably have pits and projections with an appropriate Ra and liquid repellency such that the contact angle with water is not less than 110°.

A method of manufacturing the wiring substrate according to the present embodiment is generally described.

(1) Process of Preparing a Plane on which a Metal Wire is Formed

The outline of the process of preparing a plane on which a metal wire is formed is shown in FIGS. 2A-2E.

There are roughly two types of process for preparing the plane on which a metal wire is formed. One is a method whereby a metal wire is directly formed on the substrate (see FIGS. 2A and 2B), and the other is a method whereby an organic film is formed on the substrate and then a metal wire is formed on the coated surface (see FIGS. 2C-2E). Although either method may be used, in the case where a multilayer structure is adopted with a view to increasing the per-unit-area density of the metal wire, it would be useful to adopt the method whereby a coating is formed on the substrate and then a metal wire is formed on the coated surface (FIGS. 2C-2E) for the preparation of the second and subsequent layers of organic film. Alternatively, the film may be formed by affixing a resin-based tape, paying careful attention not to introduce air bubbles. It should be noted that the method of forming a metal wire substrate according to the invention is not limited by the methods illustrated herein. The aforementioned methods are described in detail hereafter.

(1-1) A Case where a Metal Wire is Directly Formed on a Substrate

Figure 2B:
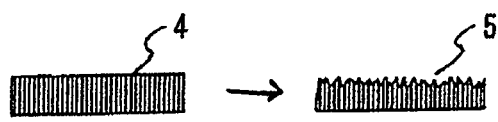

As shown in FIG. 2A, the surface of a substrate 1 made of an insulating material, such as glass, glass-epoxy resin mixture, epoxy resin, polyimide resin, or cellulose, for example, is made coarse by sandblast, for example, thereby forming an appropriate deviation of profile 2. The surface is then treated with a liquid-repellent agent, which will be described below, so as to modify the surface into a liquid-repellent surface 3. In a case where the substrate is a resin substrate 4 of polytetrafluoroethylene, for example, with a high liquid repellency, as shown in FIG. 2B, it is only necessary to provide appropriate pits and projections 5 on the surface and the process involving the repelling agent may be eliminated.

(1-2) A Case where a Resin Film is Formed on the Substrate and a Metal Wire is Formed on the Surface thereof A resin film is formed on the surface of a general-purpose substrate made of glass, glass-epoxy resin mixture, epoxy resin, or polyimide resin, for example, by coating it with a paint and then heating it, or by affixing a resin-based tape. Thereafter, the resin film is provided with pits and projections and liquid repellency. Some films are provided with pits and projections or liquid repellency upon formation of the film. These films are preferable, as they require a smaller number of steps following the formation of the film. The details of the process involving a resin film are described below.

(1-2-1) A Case where a Metal Wire is Formed After the Formation of a Resin Film, a Coarsening Process, and a Liquid Repellent Treatment.

Figure 2C:
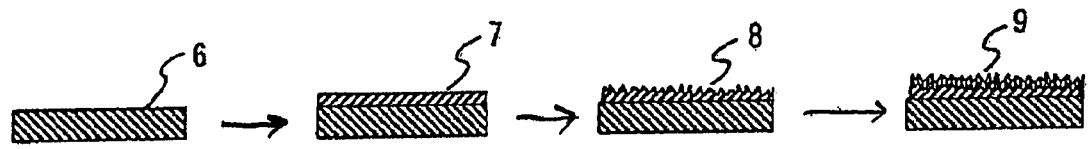

As shown in FIG. 2C, after a paint is applied to the surface of a substrate 6, the substrate is heated so as to volatilize the solvent or thermally cure the resin contained in the paint, thereby forming a film. Alternatively, a resin-based tape may be affixed. After a resin film 7 is thus formed with the paint or the tape, pits and projections 8 are formed on the film with sandpaper or by sandblast. Thereafter, a liquid-repellent agent such as fluorine is bonded to the surface so as to modify it into a liquid-repellent surface 9.

Figure 2D:
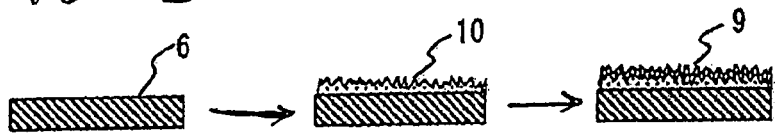

(1-2-2) A Case where a Metal Wire is Formed After the Formation of a Resin Film and the Liquid Repellent Treatment As shown in FIG. 2D, after a paint in which microparticles of $SiO_2$ or $TiO_2$ are dispersed is applied to the substrate, the substrate is heated so as to volatilize the solvent or to thermally cure the resin contained therein. In this way, a coating 10 in which microparticles are dispersed is formed. Since the thus formed coating has pits and projections produced by the microparticles, there is no need to use sandpaper or sandblasting technique to form pits and projections. Thereafter, a liquid repellent material such as a fluorine-containing compound is bonded to the surface of the coating so as to render it into a liquid-repellent surface 9.

(1-2-3) A Case where a Metal Wire is Formed After the Formation of a Resin Film.

Figure 2E:
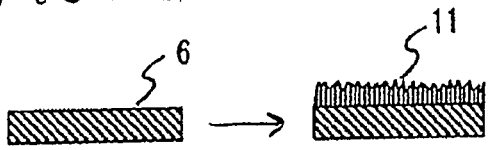

As shown in FIG. 2E, after a paint in which a fluorine liquid-repellent material that easily dissolves or is easily dispersed in the paint and microparticles of $SiO_2$ or $TiO_2$ are dispersed is applied to a substrate, the substrate is heated so as to volatilize the solvent or thermally cure the resin contained in the paint, thereby forming a coating 11 in which the repellent material and the microparticles are dispersed. Since this coating has pits and projections caused by the microparticles, there is no need to provide the film with pits and projections using sandpaper or by sandblast. The coating is particularly preferable as it has liquid repellency introduced by the fluorine repellent material and can eliminate the need to perform the repellent liquid treatment using a fluorine liquid-repellent agent.

(2) Materials Used, and Methods of Using and Processing Them.

The materials used for the formation of a metal wire and the methods of using and processing them will be described.

(2-1) Dispersion Liquid of Metal Microparticles

A basic composition of a dispersion liquid of metal microparticles includes a metal, a dispersing agent, and a dispersion medium. The metal used should preferably have high electric conductivity, such as gold, silver, or copper. When a metal that is easily oxidized, such as copper, is used, it is preferable to add an antioxidant or reducing agent in the dispersion liquid so as to control the oxidation of the metal. The dispersing agent is added in the dispersion medium, or the surface of the metal microparticles is coated therewith, for example. Examples of the dispersing agent are a material that forms a complex with a metal and a surfactant. Examples of the dispersion medium are water, alcohol liquids (methanol, ethanol, isopropanol, or the like) and hydrocarbon liquids. With regard to the dispersing medium, it is preferably of a rather high boiling point such that it is not volatilized during the interval between its discharge from an ink-jet head or the like and its landing on the substrate. However, desirably none of the dispersing medium remains when the metal wire is eventually formed. For this reason, among alcohol media, ethanol, isopropanol, propanol, isobuthylalcohol, and buthylalcohol are preferable. Among hydrocarbon media, those that are hardly volatilized during the forming of a wire but are volatilized upon heating for fusing the metal following the drawing are preferable; specifically, those with carbon numbers of 10 to 16. More specifically, decane, dodecane, tetradecane, and hexadecane are preferable.

After being applied by an ink jet method or the like, the metal microparticle dispersion liquid is turned into a metal wire by heating. Specifically, the heating causes the metal microparticles contained in the dispersion liquid to fuse and bind together, thereby acquiring electric conductivity. The heating temperature, which differs depending on the type of metal and particle diameter, is roughly in the range of 150° C. and 500° C. for diameters on the order of several nanometers to several dozens of nanometers. In the case of gold or silver, in particular, by reducing the particle diameter to the order of several nanometers, the particles can be fusion-bonded at relatively low temperatures of 150° C. to 300° C.

(2-2) Substrate Material

There is no particular limitation to the substrate and any substrate can be used as long as it satisfies the physical and chemical strength requirements of the equipment used. However, in a case where a coating is formed on the substrate, it is desirable that the substrate be made of a material that is not dissolved or swollen by the solvent of the paint used. It is also desirable that the substrate not deform when heated to temperatures of approximately 150° C. to 300° C. in order to form a metal wire, i.e., to cause the metal microparticles to bind together. For these reasons, the material of the substrate should preferably be glass, glass-epoxy resin mixture, or a metal such as SUS, rather than polyethylene, polypropylene, polystyrene, polyester, or acrylic resin, which are inferior in terms of heat resistance. Other preferable materials for the substrate include: silicon resins such as glass resin; fluorocarbon resins such as tetrafluoroethylene (PTFE), tetrafluoroethylene-ethylene copolymer (ETFE), and tetrafluoroethylene-hexafluoropropylene copolymer (FEP); and highly heat-resistant resins such as polyimide resin and melamine resin.

(2-3) Material Used for the Formation of a Resin Film

The resin film on which a metal wire is formed must be resistant to the heating temperatures present during the binding of the metal microparticles. Thus, the substrate should desirably have a heat-resistant temperature of at least 150° C. The material of the resin film should desirably be a resin or a monomer thereof that is dissolved or favorably dispersed in a paint. Preferable examples of such resin include epoxy resins, silicon resins such as polyimide and glass resin, fluorocarbon resins (such as CYTOP manufactured by Asahi Glass Co., Ltd. and INT 304-VC manufactured by INT Screen Co., Ltd.), and melamine resins, rather than polyethylene, polypropylene, polystyrene, polyester, acrylic resin, or the like, which have inferior heat resistance. The paint for the formation of the coating is prepared by adjusting a liquid that dissolves or favorably disperses the aforementioned preferable resins. The density is determined by the required thickness and the method of application.

Examples of the method of coating the paint include dip coating, spin coating, spray coating, flow coating, roll coating, and bar coating. When the paint has a high viscosity, dip coating, spin coating, spray coating, and flow coating tend to result in a poorer flatness of the film, whereas an improved flatness can be obtained by roll coating or bar coating, for example. Even when the density of the paint is the same, spin coating tends to produce thinner films than dip coating or flow coating, particularly when spin coating is performed at a high speed. Spray coating is useful in that it is capable of producing a desired film thickness by controlling the amount of discharge per unit time and the duration of time per unit area. When the resistance of the resin is low, the film thickness may be increased in order to enhance insulation.

(2-4) Resin-based Tape

A level of heat resistance similar to those of the aforementioned materials for a resin film is required for the resin used in the resin-based tape. The resin-based tape must also include an adhesion layer for enabling adhesion to the substrate. When affixing the resin-based tape, utmost care must be taken to ensure that no air bubbles are introduced, for the air bubbles could potentially expand due to heating during the subsequent formation of wires and greatly alter the surface shape.

(2-5) Methods of Coarsening the Surface

Methods of providing the resin film surface with pits and projections are described.

(2-5-1) Method of Coarsening the Surface by a Physical Means

Appropriate pits and projections can be obtained by sandblasting the surface of the substrate or the resin film or by rubbing it with sandpaper.

Sandblasting is a technique for coarsening the surface of a substrate, for example, by spraying the surface with microparticles of an abrasive material. The abrasive material should preferably be a ceramic material with a high degree of hardness, such as alumina, silicon carbide, or zirconia, because such a material reduces the time required for polishing. Although there are other examples of the abrasive material, such as glass, metals, and resins, ceramics are preferable to glass or metals in terms of hardness.

When sandpaper is used, the substrate surface is rubbed with sandpaper of an appropriate grit number, thereby forming pits and projections on the surface of the organic film.

(2-5-2) Method of Coarsening the Surface Using Microparticles

The surface pits and projections may also be obtained upon the formation of the resin film by mixing microparticles of an appropriate size in the paint that forms the resin film. The material of the microparticles is preferably one that does not dissolve in the solvent in the paint or in the dispersion medium.

If the specific gravity of the microparticles is large, the microparticles might settle out a short while after they have been added to the paint and allowed to stand. Accordingly, the specific gravity of the particles is preferably not more than 4. Specific examples are resins (with specific gravity varying depending on the type of resin but generally ranging from 0.8 to 1.2), silicon oxides (specific gravity of about 2.2), titanium oxides (specific gravity of about 3.7), and alumina (specific gravity of about 3.5). However, when a resin is used for the microparticles, a resin must be selected that hardly decomposes at the temperature at which the metal microparticles are fused. When all of the above are considered, silicon oxide and polyimide, which have a high heat resistance and a small specific gravity, are particularly preferable. While microparticles with larger specific gravity tend to settle more easily, microparticles with too small a specific gravity will likely aggregate. Microparticles with larger surface areas settle with increasing difficulty. As the proportion of the microparticles that are added increases, the film that is formed tends to be increasingly weak, particularly for larger particle sizes. The size of the pits and projections produced on the resin film also varies depending on the amount of the microparticles added, as well as the size of the individual particles. Specifically, the size of the pits and projections tends to be smaller as the amount of the microparticles added decreases. This is believed to be due to some of the particles added being completely embedded in the coating and failing to contribute to the formation of the surface pits and projections. Agitating well prior to application is useful in improving the dispersion of the particles in the coating.

Adding a dispersing agent together with the microparticles is useful as it will improve the dispersion of the particles in the paint and contribute to the prevention of settlement to some extent.

In cases where the solvent of the paint or the dispersion medium is an organic solvent, the dispersing agent should preferably be a nonionic surfactant that has a favorable dissolving or dispersion property with respect to organic matter. In the case of aqueous surfactant, an appropriate one is selected from anionic surfactants, cationic surfactants, and nonionic surfactants. It should be noted, however, that increasing the amount of surfactant that is added tends to decrease the physical strength of the film while improving the dispersibility of the microparticles. This is presumably because the surfactant decreases the interaction between resins by which the film is formed.

Some liquid repellent agents, as will be described later, also function as dispersants, and using such liquid repellent agents is preferable as they would eliminate the need for a liquid repellent treatment.

(2-6) Liquid Repellent Agent

Liquid repellent agents can be roughly divided into two types. One consists of paint-mixed type liquid repellent agents that can exhibit a liquid repellent property simply by being mixed with a paint and forming a film. The other consists of resin-surface liquid repellent agents that modify the surface of a resin film so that it becomes liquid repellent after the formation of the film.

(2-6-1) Paint-mixed Type Liquid Repellent Agents

Examples of the paint-mixed type liquid repellent agents include compounds that contain a long alkyl chain and fluorine-containing compounds containing fluorine atoms in their molecules. Particularly, fluorine-containing compounds are preferable as they can more readily improve liquid repellency. Examples of the fluorine-containing compounds include compounds having a perfluoroalkyl chain, compounds having a perfluoropolyether chain, and compounds having a fluoro group in an aromatic ring. Of these, the compounds with a perfluoroalkyl chain and the compounds with a perfluoropolyether chain are more effective in improving liquid repellency.

It is generally preferable that, when preparing a paint by mixing a liquid repellent agent with a resin or the like, the liquid repellent agent be dissolved or favorably mixed in the solvent used, as this would ensure a uniform distribution of the repellent agent during the formation of a coating. However, those compounds with a perfluoroalkyl chain or a perfluoropolyether chain that have large molecular weights have low solubility in organic solvents (such as acetone, ethylmethylketone, dichloromethane, N,N-dimethylformamide, N-methyl-2-pyrrolidone, and isophorone) that have good compatibility with resins. For this reason, if solubility decreases, it is desirable to bind an appropriate residue to a terminal of the compound so as to ensure solubility in these organic solvents.

In one method, the solubility in the organic solvents can be ensured by rendering the terminal of the perfluoroalkyl chain or perfluoropolyether chain into a halogenated alkylene portion by means of $CH_2I$ or $CH_2Br$ ($CH_2Br$ materials are less reactive than $CH_2I$ materials), for example, and causing the terminal to react with a material, such as normal-chain or branched-chain hexanol, octanol, cis- or trans-cyclohexanol, or a catechol derivative, in which the hydroxyl group has been converted into alcoholate such as ONa or OK, such that the compound can bind to the organic solvent via an ester bond. It is also conceivable to ensure solubility in the organic solvents by causing the aforementioned perfluoroalkyl chain or perfluoropolyether chain with a halogenated alkylene portion to react with a material with an amino group at the terminal thereof (such as aniline, normal-chain or branched-chain hexylamine, octylamine, or decylamine, for example), such that the compound can bind to the organic solvent via an amine bond. Examples of the material with a perfluoroalkyl chain having a halogenated alkylene portion at the terminal thereof include 2-(perfluorobutyl)ethyliodide, 2-(perfluorohexyl)ethyliodide, 2-(perfluorooctyl)ethyliodide, 2-(perfluorodecyl)ethyliodide, 2-(perfluoro-5-methylhexyl)ethyliodide, 2-(perfluoro-5-methyloctyl)ethyliodide, 2-(perfluoro-5-methyldecyl)ethyliodide, 2,2,3,3-tetrafluoropropyliodide, and 1H,1H,7H-decafluoroheptyliodide. In another useful method of ensuring solubility in organic solvents, a material with a perfluoroalkyl chain or perfluoropolyether chain having $CH_2OH$ at the terminal thereof is caused to react with a material with a halogenated alkylene terminal (such as benzylbromide, normal-chain or branched-chain hexylbromide, octylbromide, or decylbromide, for example), in order to realize an ether bond. In yet another useful method, a material with a perfluoroalkyl chain or perfluoropolyether chain having $CH_2OH$ at the terminal thereof is caused to react with a material with a carboxyl group at the terminal thereof (such as benzoic acid, normal-chain or branched-chain hexanoic acid, octanoic acid, or decanoic acid, for example), in order to realize an ester bond. Examples of the material with a perfluoroalkyl chain or perfluoropolyether chain having $CH_2OH$ at the terminal thereof include 2-(perfluorohexyl)ethanol, 2-(perfluorooctyl)ethanol, 2-(perfluorodecyl)ethanol, 2-(perfluorohexyl)propanol, 2-(perfluorooctyl)propanol, 2-(perfluorodecyl)propanol, Demnum SA manufactured by Daikin Kogyo Co., Ltd., and Fombrin Z-DOL manufactured by Augimont, for example. Krytox 157 FS materials manufactured by DuPont have terminals that are perfluoropolyether of a carboxyl group. The terminals can be reduced with lithium aluminum hydride to be converted into $CH_2OH$. Thus, the reduced material can also be used as the aforementioned material with a $CH_2OH$ terminal.

Solubility in organic solvents can also be enhanced by causing a material with a perfluoroalkyl chain or perfluoropolyether chain having $CO_2H$ at the terminal thereof to react with a material with an amino group at the terminal thereof (such as aniline, normal-chain or branched-chain hexylamine, octylamine, or decylamine), thereby forming an amide bond. Solubility can also be enhanced by causing a material with a perfluoroalkyl chain or perfluoropolyether chain with a $CO_2H$ terminal to react with a material with a hydroxyl group at the terminal thereof (such as normal-chain or branched-chain hexanol, octanol, cis- or trans-cyclohexanol, or a catechol derivative, for example) so as to realize an ester bond. Examples of the material with a perfluoroalkyl chain or perfluoropolyether chain with a $CO_2H$ terminal include perfluorohexanoic acid, perfluorooctanoic acid, perfluorodecanoic acid, 7H-dodecafluoroheptanoic acid, 9H-hexadecafluorononanoic acid, perfluoroazelaic acid, Demnum SH manufactured by Daikin Kyogyo Co., Ltd., Fombrin Z-DIAC manufactured by Augimont, and Krytox 157FS-L, 157FS-M, and 157FS-H manufactured by DuPont.

Solubility in organic solvents can also be enhanced by causing a material with a perfluoroalkyl chain or perfluoropolyether chain with an epoxy group terminal to react with a material with an amino group at the terminal thereof and with a material with a hydroxyl group at the terminal thereof, such that the material can bind to the organic solvents via a variety of bonds. Examples of the material with a perfluoroalkyl chain or perfluoropolyether chain having an epoxy group at the terminal thereof include 3-perfluorohexyl-1,2-epoxypropane, 3-perfluoroocthyl-1,2-epoxypropane, 3-perfluorodecyl-1,2-epoxypropane, 3-(perfluoro-5-methylhexyl)-1,2-epoxypropane, 3-(perfluoro-5-methylocthyl-1,2-epoxypropane, 3-(perfluoro-5-methyldecyl)-1,2-epoxypropane, 3-(1H,1H,7H-decafluoroheptyloxy)-1,2-epoxypropane, 3-(1H,1H,9H-hexadecafluorononyloxy)-1, and 2-epoxypropane.

In consideration of the foregoing, as an example of those fluorine-containing compounds that are easily soluble in an organic solvent, that have good compatibility with polyimide, glass resin, or epoxy resin that is used, and that can exhibit sufficient liquid repellency, the following is mentioned:

$$Rf(R)_z$$

where Rf has the following structure:

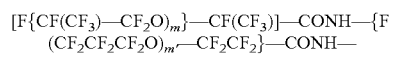

or

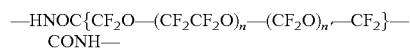

where m, m', n, and n' are natural numbers; and where R has the following structure:

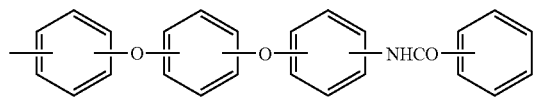

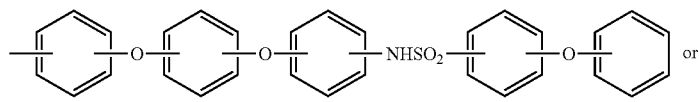 or

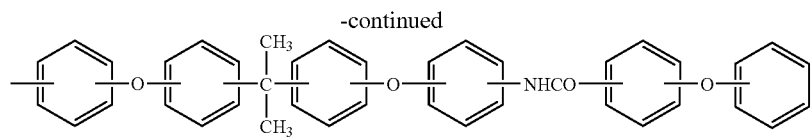
where z is 1 or 2.
Of these compounds, the following compounds 1 to 11 are particularly preferable in terms of compatibility with the resin used:
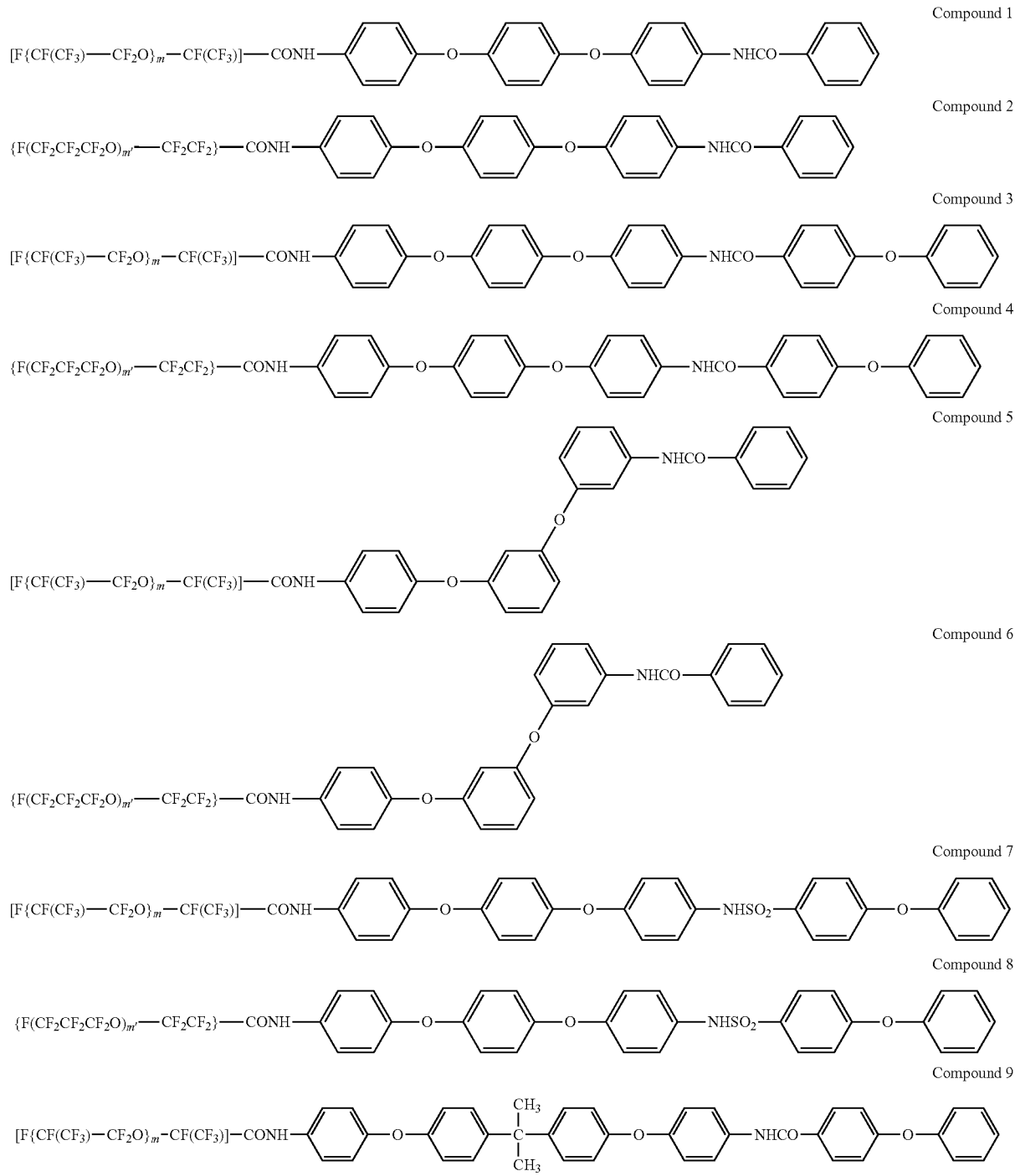

Compound 10

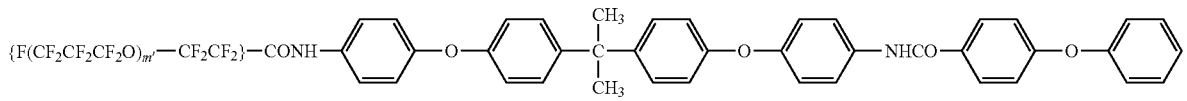

Compound 11

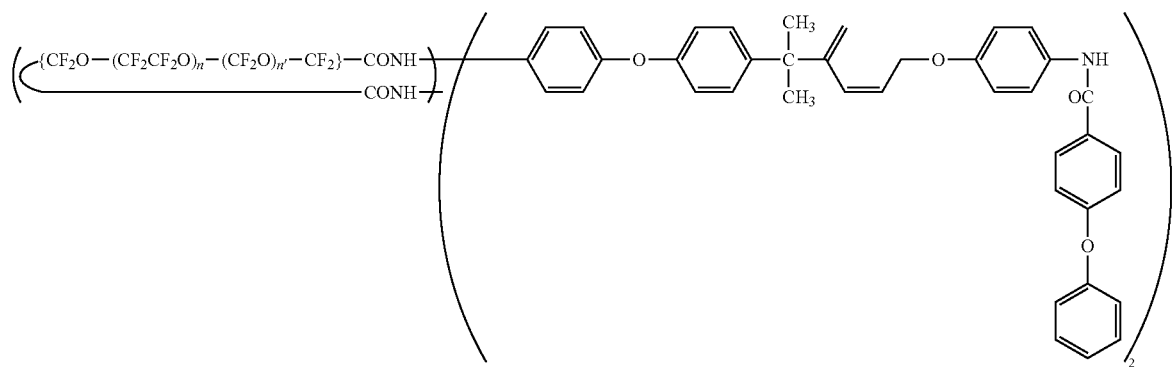

With regard to the number average molecular weight of the perfluoropolyether chain, 1500 to 5000 for Compounds 1 to 8, 2000 to 9000 for Compounds 9 and 10, and 2000 to 5000 for Compound 11 can provide good compatibility with the monomer and are therefore suitable.

Those compounds in which the perfluoropolyether chain comprises a repetition unit of —CF(CF$_3$)—CF$_2$O— can employ Krytox 157FS-L, 157FS-M, or 157FS-H from DuPont as raw material. Those compounds in which the repetition unit comprises —CF$_2$CF$_2$CF$_2$O— can employ Demnum SH from Daikin Kogyo Co., Ltd., as raw material. And those with a repetition unit consisting of —CF$_2$CF$_2$O— and —(CF$_2$O)— can employ Fombrin Z-DIAC from Augimont as raw material.

Methods for actually synthesizing the aforementioned fluorine-containing compounds will be described below. It should be noted, however, that the following are merely examples and any other methods may be employed as long as they are capable of producing the aforementioned fluorine-containing compounds.

Synthesis of Compound 1

KRYTOX 157FS-L by DuPont (average molecular weight: 2500) (25 parts by weight) is dissolved into FC-72 (100 parts by weight) made by 3M Company, and thionyl chloride (2 parts by weight) and dichloromethane (20 parts by weight) are added thereto. The solution is refluxed with agitation for 48 hours. Thionyl chloride and FC-72 are volatilized in an evaporator, thereby obtaining a chloroformyl structure (25 parts by weight) of KRYTOX 157FS-L.

1,4-bis(4-aminophenoxy)benzene (29 parts by weight) and triethyl amine(25 parts by weight) made by Mitsui Toatsu Chemicals Co., Ltd. are dissolved into dichloromethane (300 parts by weight). While the solution is agitated, benzoyl chloride (14 parts by weight) dissolved into dichloromethane (100 parts by weight) is added dropwise to the solution for two hours. After that, the solution is agitated for another 20 hours. The reaction solution is filtrated using filter paper, and the filtrate is concentrated by the evaporator. Then, the solution is separated and refined by column chromatography (WAKO-GEL C-200 made by Wako Pure Chemical Industries, Ltd.), thereby obtaining Compound 12 (20 parts by weight) having a benzene ring on one side of the amino group.

Compound 12

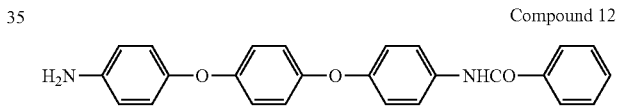

Then, a chloroformyl structure (25 parts by weight) of KRYTOX 157FS-L, Compound 12 (4 parts by weight), triethyl amine (2 parts by weight) and dichloromethane (20 parts by weight) are added to FC-72 (100 parts by weight), and the solution was refluxed with agitation for 48 hours. The reaction solution is filtrated using filter paper, and the filtrate is left to stand for 12 hours. The dichloromethane layer is removed from the surface, and new dichloromethane (20 parts by weight) is added. After agitation for one hour, it is left to stand for 12 hours. The dichloromethane layer is removed from the surface, and FC-72 in the lower FC-72 layer is volatilized by an evaporator and a vacuum pump, thereby achieving the intended Compound 1 (25 parts by weight).

Synthesis of Compound 2

Compound 2 (35 parts by weight) is obtained via a method similar to that used for synthesizing Compound 1, except that DEMNUM SH by Daikin Kogyo (average molecular weight: 3500) (35 parts by weight) is used instead of KRYTOX 157FS-L of DuPont (average molecular weight: 2500) (25 parts by weight).

Synthesis of Compound 3

Compound 13 (25 parts by weight) is obtained via a method similar to that used for synthesizing Compound 12, except that 4-phenoxybenzoyl chloride (23 parts by weight) is used instead of benzoyl chloride (14 parts by weight).

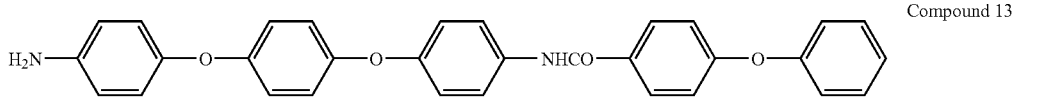

Compound 13

After this, Compound 3 (25 parts by weight) is obtained via a method similar to that used for synthesizing Compound 1 except that Compound 13 (5 parts by weight) is used instead of Compound 12 (4 parts by weight).

Synthesis of Compound 4

Compound 4 (35 parts by weight) is obtained via a method similar to that used for synthesizing Compound 3 except that DEMNUM SH by Daikin Kogyo (average molecular weight: 3500) (35 parts by weight) is used instead of KRYTOX 157FS-L of DuPont (average molecular weight: 2500) (25 parts by weight).

Synthesis of Compound 5

Compound 14 (20 parts by weight) is obtained via a method similar to that used for synthesizing Compound 12 except that 1,3-bis(4-aminophenoxy)benzene (29 parts by weight) made by Mitsui Toatsu Chemicals Co., Ltd. is used instead of 1,4-bis(4-aminophenoxy) benzene(29 parts by weight).

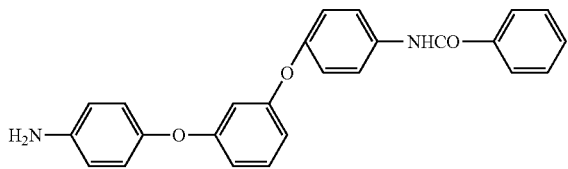

Compound 14

Compound 5 (25 parts by weight) is obtained via a method similar to that used for synthesizing Compound 1, except that Compound 14 (4 parts by weight) is used instead of Compound 12 (4 parts by weight).

Synthesis of Compound 6

Compound 6 (35 parts by weight) is obtained via a method similar to that used for synthesizing Compound 5, except that DEMNUM SH by Daikin Kogyo (average molecular weight 3500) (35 parts by weight) is used instead of KRYTOX 157FS-L of DuPont (average molecular weight 2500) (25 parts by weight).

Synthesis of Compound 7

Compound 15 (21 parts by weight) is obtained via a method similar to that used for synthesizing Compound 12, except that 4-phenoxybenzene sulfonyl chloride (18 parts by weight) is used instead benzoyl chloride (14 parts by weight).

Compound 7 (25 parts by weight) is obtained via a method similar to that used for synthesizing Compound 1 except that Compound 15 (5 parts by weight) is used instead of Compound 12 (4 parts by weight).

Synthesis of Compound 8

Compound 8 (35 parts by weight) is obtained via a method similar to that used for synthesizing Compound 7 except that DEMNUM SH by Daikin Kogyo (average molecular weight: 3500) (35 parts by weight) is used instead of KRYTOX 157FS-L of DuPont (average molecular weight: 2500) (25 parts by weight).

Synthesis of Compound 9

Compound 16 (30 parts by weight) is obtained via a method similar to that used for synthesizing Compound 12 except that 2,2-bis[(4-aminophenoxy)phenyl]propane (41 parts by weight) made by Mitsui Toatsu Chemicals Co., Ltd. is used instead of 1,4-bis(4-aminophenoxy)benzene (29 parts by weight).

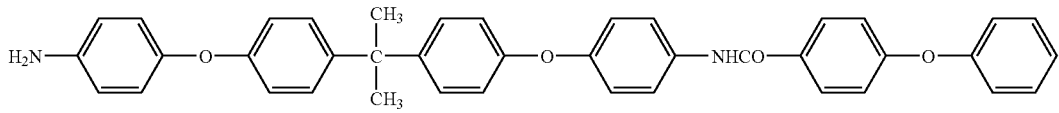

Compound 16

Compound 9 (25 parts by weight) is obtained via a method similar to that used for synthesizing Compound 1, except that Compound 16 (7 parts by weight) is used instead of Compound 12 (4 parts by weight).

Synthesis of Compound 10

Compound 10 (35 parts by weight) is obtained via a method similar to that used for synthesizing Compound 9, except that DEMNUM SH by Daikin Kogyo (average molecular weight 3500) (35 parts by weight) is used instead of KRYTOX 157FS-L of DuPont (average molecular weight 2500) (25 parts by weight).

Synthesis of Compound 11

FOMBRIN Z-DOL by Augimont (average molecular weight 4000) (40 parts by weight) is dissolved in FC-72 (200 parts by weight). N,N-dicyclohexyl carbodiimide (5 parts by weight), Compound 16 (13 parts by weight), and dichloromethane (100 parts by weight) are added thereto and the resultant is agitated for 120 hours. After the reaction solution is filtrated using filter paper, the filtrate is left to stand for 12 hours. The dichloromethane layer is removed from the surface, and FC-72 in the lower FC-72 layer is volatilized by an evaporator and vacuum pump, thereby achieving the intended Compound 11 (40 parts by weight).

The paint that employs a paint-mixed type liquid repellent agent is prepared by mixing the paint-mixed type liquid repellent agent with an organic solvent, microparticles, and a resin sufficiently. The mixing method is not particularly limited and may be any appropriately selected method, such as a method employing an agitating tool, a method employing an agitating rod, a method employing an agitating machine, or a

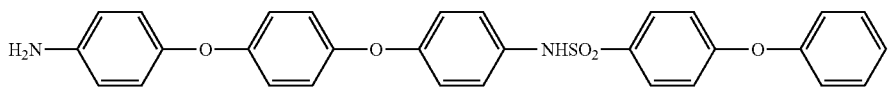

Compound 15 method employing an ultrasonic washing machine, for example. When an agitating tool, an agitating rod, or an agitating machine is used, a large volume of air could be introduced into the paint in the form of air bubbles. If the paint in that state were to be applied and then heated to form a coating, the air bubbles could possibly expand and burst, thereby reducing the adhesion between the coating and the substrate or causing the coating to be partially peeled off. Thus, if air bubbles have been or are likely to have been introduced, the aforementioned problems can be prevented by inducing vibrations in the paint using an ultrasound washing machine or the like so as to expel air sufficiently.

(2-6-2) Resin Surface Liquid Repellent Agent

Methods of providing the resin film surface with liquid repellency by applying a liquid repelling agent after coarsening the surface will be described.

After the surface of the resin film is coarsened by the aforementioned physical coarsening processes or by the addition of microparticles in the coating, the resin film surface can be provided with liquid repellency by appropriately applying or binding a liquid repelling material thereto.

(1) Application-type Liquid Repellent Agent

A fluorine-containing resin (such as CYTOP manufactured by Asahi Glass Co., Ltd., and INT 304-VC manufactured by INT Screen Co., Ltd.) is diluted in a fluorine-containing solvent and then applied to the surface. If the concentration is too high, the pits and projections on the coarsened surface could be filled in. Thus, it is important to determine the concentration of the application in light of the size of the pits and projections that are formed.

(2) Liquid Repellent Agent that Chemically Binds to the Resin Film

It is preferable to use a material for the liquid repellent agent that chemically binds to the surface when it is applied, as this will also improve the durability of the liquid repellent agent. From this viewpoint, the following materials having an alkoxysilane structure terminal can be mentioned. When these bind to the resin film, a binding site such as a hydroxyl group or a carboxyl group is necessary. In the case where the resin itself includes a hydroxyl group, such as a phenol resin, the resin reacts with the terminal alkoxysilane so that the liquid repellent agent can bind to the resin without the need to separately provide a binding site. In cases where there is no binding site, the resin film can be exposed to ozone or irradiated with ultraviolet light or oxygen plasma in order to form a hydroxyl group on the surface thereof, which, as a binding site, can then be reacted with the following liquid repellent agent to form a bond.

[F{CF(CF$_3$)—CF$_2$O}$_n$—CF(CF$_3$)]—X—Si(OR)$_3$

{F(CF$_2$CF$_2$CF$_2$O)$_n$}—X—Si(OR)$_3$

{H(CF$_2$)$_n$}—Y—Si(OR)$_3$

{F(CF$_2$)$_n$}—Y—Si(OR)$_3$ where X is a binding site between a perfluoropolyether chain and an alkoxysilane residue, Y is a binding site between a perfluoroalkyl chain and an alkoxysilane residue, and R is an alkyl group.

Specifically, the following compounds 17 to 28 can be mentioned.

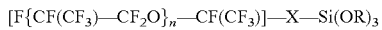

F{CF(CF$_3$)—CF$_2$O}$_n$—CF(CF$_3$)—CONH—(CH$_2$)$_3$—Si(OCH$_2$CH$_3$)$_3$    Compound 17

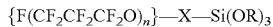

F{CF(CF$_3$)—CF$_2$O}$_n$—CF(CF$_3$)—CONH—(CH$_2$)$_3$—Si(OCH$_3$)$_3$    Compound 18

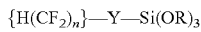

F{CF$_2$CF$_2$CF$_2$O}$_n$—CF$_2$CF$_2$—CONH—(CH$_2$)$_3$—Si(OCH$_2$CH$_3$)$_3$    Compound 19

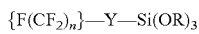

F{CF$_2$CF$_2$CF$_2$O}$_n$—CF$_2$CF$_2$—CONH—(CH$_2$)$_3$—Si(OCH$_3$)$_3$    Compound 20

H(CF$_2$)$_6$—CONH—(CH$_2$)$_3$—Si(OCH$_2$CH$_3$)$_3$    Compound 21

H(CF$_2$)$_6$—CONH—(CH$_2$)$_3$—Si(OCH$_3$)$_3$    Compound 22

H(CF$_2$)$_8$—CONH—(CH$_2$)$_3$—Si(OCH$_2$CH$_3$)$_3$    Compound 23

H(CF$_2$)$_8$—CONH—(CH$_2$)$_3$—Si(OCH$_3$)$_3$    Compound 24

F(CF$_2$)$_6$—(CH$_2$)$_2$—Si(OCH$_3$)$_3$    Compound 25

F(CF$_2$)$_8$—(CH$_2$)$_2$—Si(OCH$_3$)$_3$    Compound 26

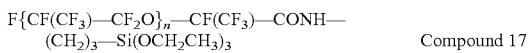

F(CF$_2$)$_6$—(CH$_2$)$_2$—Si(OCH$_2$CH$_3$)$_3$    Compound 27

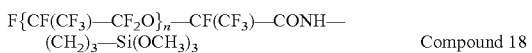

F(CF$_2$)$_8$—(CH$_2$)$_2$—Si(OCH$_2$CH$_3$)$_3$    Compound 28

Of these, Compounds 17 to 24 can be obtained by carrying out the synthesizing method described below. Compounds 25 to 28 are commercially available from Hydrus Chemical Inc. with the compound names of 1H,1H,2H,2H-perfluorohexyltrimethoxysilane, 1H,1H,2H,2H-perfluorooctyltriethoxysilane, 1H,1H,2H,2H-perfluorohexyltrimethoxysilane, and 1H,1H,2H,2H-perfluorooctyltriethoxysilane. Other commercially available materials include Optool DSX manufactured by Daikin Kogyo Co., Ltd. It should be noted that, as in the previous case, the method of synthesis is not limited to the following and any method may be used as long as it can produce the fluorine-containing compounds of the aforementioned compositions.

Synthesis of Compound 17

KRYTOX 157FS-L made by DuPont (average molecular weight: 2500) (25 parts by weight) is dissolved into PF-5080 (100 parts by weight) by 3M Company, and thionyl chloride (20 parts by weight) is added thereto. The solution is then refluxed with agitation for 48 hours. Thionyl chloride and PF-5080 are volatilized in an evaporator, thereby obtaining an acid chloride (25 parts by weight) of KRYTOX 157FS-L. Then, PF-5080 (100 parts by weight), SAIRA ACE S330 (3 parts by weight) by Chisso Co. and triethylamine (3 parts by weight) are added, and the solution is agitated for 20 hours at room temperature. The reaction solution is filtrated by RADIOLITE FINEFLOW A by Showa Chemical Industry Co. Ltd., and PF-5080 in the filtrate is volatilized using an evaporator to obtain Compound 17 (20 parts by weight).

Synthesis of Compound 18

Compound 18 (20 parts by weight) is obtained via a method similar to that used for synthesizing Compound 17 except that SAIRA ACE S360 (3 parts by weight) by Chisso Co. is used instead of SAIRA ACE S330 (3 parts by weight) by Chisso Co.

Synthesis of Compound 19

Compound 19 (30 parts by weight) is obtained via a method similar to that used for synthesizing Compound 17 except that DEMNUM SH (average molecular weight 3500) (35 parts by weight) made by Daikin Kogyo Co., Ltd. is used instead of Krytox 157FS-L (average molecular weight 2500) (25 parts by weight) made by DuPont.

Synthesis of Compound 20

Compound 20 (30 parts by weight) is obtained via a method similar to that used for synthesizing Compound 17 except that SAIRA ACE S360 (3 parts by weight) by Chisso Co. is used instead of SAIRA ACE S330 (3 parts by weight) by Chisso Co., and that DEMNUM SH (average molecular weight 3500) (35 parts by weight) made by Daikin Kogyo Co., Ltd. is used instead of Krytox 157FS-L (average molecular weight 2500) (25 parts by weight) made by DuPont.

Synthesis of Compound 21

Compound 21 (3.5 parts by weight) is obtained via a method similar to that used for synthesizing Compound 17 except that 7H-dodecafluoroheptanoic acid (molecular weight 346.06) (3.5 parts by weight) by Daikin Kogyo Co., Ltd. is used instead of Krytox 157FS-L (average molecular weight 2500) (25 parts by weight) by DuPont.

Synthesis of Compound 22

Compound 22 (3.5 parts by weight) is obtained via a method similar to that used for synthesizing Compound 17 except that 7H-dodecafluoroheptanoic acid (molecular weight 346.06) (3.5 parts by weight) made by Daikin Kogyo Co., Ltd. is used instead of Krytox 157FS-L (average molecular weight 2500) (25 parts by weight) made by DuPont, and that SAIRA ACE S360 (2 parts by weight) made by Chisso Co. is used instead of SAIRA ACE S330 (2 parts by weight) made by Chisso Co.

Synthesis of Compound 23

Compound 23 (4.5 parts by weight) is obtained via a method similar to that used for synthesizing Compound 17 except that 9H-hexadecafluorononanoic acid (molecular weight 446.07) (4.5 parts by weight) made by Daikin Kogyo Co., Ltd. is used instead of Krytox 157FS-L (average molecular weight 2500) (25 parts by weight) made by DuPont.

Synthesis of Compound 24

Compound 24 (4.5 parts by weight) is obtained via a method similar to that used for synthesizing Compound 17 except that 9H-hexadecafluorononanoic acid (molecular weight 446.07) (4.5 parts by weight) made by Daikin Kogyo Co., Ltd. is used instead of Krytox 157FS-L (average molecular weight 2500) (25 parts by weight) made by DuPont, and that SAIRA ACE S360 (2 parts by weight) made by Chisso Co. is used instead of SAIRA ACE S330 (2 parts by weight) made by Chisso Co.

Although examples of the fluorine-containing compounds include those having a perfluoroalkyl chain or a perfluoropolyether chain, and those having a fluoro group or a trifluoromethyl group in an aromatic ring, the compounds that include a perfluoroalkyl chain or a perfluoropolyether chain are more effective in enhancing liquid repellency. Those compounds with a perfluoroalkylene chain that contains hydrogen at one of the terminals thereof are also effective.

If the number of the $CF_2$ units in the perfluoroalkyl chain or the perfluoroalkylene chain is too small, a sufficient liquid repellency cannot obtained. Thus, the number of the $CF_2$ units should preferably be six or more. In the case of compounds that include a perfluoropolyether chain, since liquid repellency is reduced if the molecular weight is too small, it is desirable that the average molecular weight of the compound be 800 or larger.

The terminal of the perfluoroalkyl chain or the perfluoropolyether chain includes an alkoxysilyl group as a residue for forming a chemical bond with the coarsened surface, such as a trimethoxysilyl group, a triethoxysilyl group, a dimethoxysilyl group, or a diethoxysilyl group. These residues react with a hydroxyl group, for example, on the surface upon heating such that it is fixed to the surface via oxygen atoms. Thus, when placed in an environment with high temperature and humidity, the terminal alkoxysilyl group in these compounds tend to be subject to hydrolysis. Accordingly, it is preferable to store such compounds in a refrigerator or the like. In particular, a trimethoxysilyl group at the terminal is more likely to be subject to hydrolysis than a triethoxysilyl group, a dimethoxysilyl group, or a diethoxysilyl group. Therefore, in terms of storage stability, it is preferable to use those compounds with a triethoxysilyl group, a dimethoxysilyl group, or a diethoxysilyl group at the terminal thereof.

These compounds can be applied to the coarsened surface by either spin coating or dip coating. With regard to the solvent used, one in which the compound can be dissolved is easier to handle. However, although alcoholic solvents are capable of dissolving some of the compounds, they react with water in the solution and polymerize, possibly reducing the life of the coating liquid. In that sense, fluorine-containing solvents are preferable in that they hardly dissolve water. In addition, fluorine-containing solvents have the added advantage of allowing the coating liquid to be applied on the surface in a very thin sheet due to their small surface tension, and therefore allowing a very thin film to be produced. Examples of fluorine-containing solvents include FLUORINERT FC-72, FC-77, PF-5080, HFE-7100, HFE-7200 by 3M Company, and VERTREL XF by DuPont.

EXAMPLES

The invention will be hereafter described in more detail by way of examples thereof. It is to be noted, however, that the examples are intended to be used for illustrative purposes only and do not limit the scope of the invention.

Example 1

This example relates to the method of preparing a substrate using a general-purpose substrate (see FIG. 2A).

1. Preparation of a Substrate for Wiring

The surface of a glass substrate measuring 100×50 mm and having a thickness of 1 mm was coarsened using a sandblasting apparatus (Pneuma-Blaster SFK 2 from Fuji Manufacturing Co., Ltd.). The polishing material used was a Fuji Random A ceramic polishing material from Fuji Manufacturing Co., Ltd. (where a particle range of 53 to 75 μm was used for Ra<1 μm and a range of 180 to 212 μm was used for Ra≧1 μm). A surface with varying Ra was formed by varying the blast time.

To impart liquid repellency to the substrate, the thus coarsened glass substrate was then dipped in a 0.5% by weight solution of Compound 17 (with a Fluorinert PF-5080 solvent from 3M Company). The substrate was then raised and heated at 130° C. for 15 minutes to obtain a substrate for wiring.

Table 1 shows the Ra values of the substrate and the contact angle with water on the substrate surface.

TABLE 1

Condition of wires formed on substrates with different deviation of profile

| Ra (μm) | Contact angle with water (°) | Width of wire drawn (μm) | | | |
|---|---|---|---|---|---|
| | | 30 | 60 | 100 | 150 |
| 0.011 | 112 | C | C | C | C |
| 0.036 | 126 | C | C | C | C |
| 0.058 | 136 | C | C | C | C |
| 0.062 | 138 | X | X | X | X |
| 0.077 | 146 | X | X | X | X |
| 1.45 | >150 | X | X | X | X |
| 1.52 | >150 | S | X | X | X |
| 2.84 | >150 | S | X | X | X |
| 3.12 | >150 | S | S | X | X |
| 4.91 | >150 | S | S | X | X |
| 5.19 | >150 | S | S | S | X |
| 7.41 | >150 | S | S | S | X |
| 7.63 | >150 | S | S | S | S |

C: Disconnection exists.
S: Short circuit exists.
X: No disconnection or short circuit exists.

The contact angle was measured using a CA-D contact angle meter from Kyowa Interface Science Co., Ltd., and Ra was measured using Surfcom 130A from Tokyo Seimitsu. Contact angles of 150° or larger cannot be measured because at these angles a water droplet from the syringe of the contact angle meter does not become attached to the substrate. In the table, such cases of water droplets from the syringe failing to become attached to the substrate are indicated by ">150" in the contact angle column. The same notation is used in the tables for other examples.

2. Wiring

Wiring was provided on the substrate prepared in the above-described manner using a dispersion liquid of silver microparticles. To provide wiring, a wiring pattern was drawn on the substrate by causing a liquid droplet that was 15 picoliters in volume to be discharged from a GEN3E1 head manufactured by Hitachi Printing Solutions and causing it to become attached to the substrate. The volume of silver in the ink used was 15%, and the dispersion medium consists primarily of hydrocarbon with a carbon number of 12 to 16, with a surface tension of 32 mN/m. The widths of the wires drawn were 30, 60, 100, and 150 μm. The droplet was discharged such that when the dispersion medium had dried, a wire with a thickness of 10 μm was formed. The distance between wires was made to be the same as the width of the wire formed.

After the wiring pattern was drawn using the silver microparticle dispersion liquid, the substrate was heated at 250° C. for 30 min. As a result, the dispersion medium volatilized while the silver microparticles were fused, thereby forming the wires.

3. Evaluation

After the formation of the wires, a continuity test was conducted to examine if there was any disconnection or short circuiting. The result is also shown in Table 1.

The result indicated that, as shown in Table 1, the presence or absence of disconnection or short circuit was due to the difference in the width of the wire and the surface deviation of profile Ra. Table 2 shows an upper limit ($5 \times 10^{-2}$D, where D is the width of wire) and a lower limit (60 nm, or 0.06 μm) of Ra as recited in the attached claims that correspond to the widths of the wires that were drawn in the present example.

TABLE 2

Lower and upper limits of Ra in the claims, corresponding to width of wire

| Upper/lower limits of Ra | Width D of wire drawn (μm) | | | |
|---|---|---|---|---|
| | 30 | 60 | 100 | 150 |
| Lower limit | 0.06 | 0.06 | 0.06 | 0.06 |
| Upper limit: $5 \times 10^{-2}$D (μm) | 1.5 | 3 | 5 | 7.5 |

When the wire width is 30 μm, the upper limit of Ra in the claims is 1.5 μm. There was neither disconnection nor short circuit when Ra was 0.062 to 1.45 μm. A disconnection arose when Ra was 0.058 μm or smaller. A short circuit arose when Ra was 1.52 μm or larger. These results showed that a wire can be formed without either disconnection or short circuit within the upper and lower limits of Ra recited in the claims.

When the wire width is 60 μm, the upper limit of Ra in the claims is 3 μm. There was neither disconnection nor short circuit when Ra was 0.062 to 2.84 μm. A disconnection arose when Ra was 0.058 μm or smaller. A short circuit arose when Ra was 3.12 μm or larger. These results showed that a wire can be formed without either disconnection or short circuit within the upper and lower limits of Ra recited in the claims.

When the wire width is 100 μm, the upper limit of Ra in the claims is 5 μm. There was neither disconnection nor short circuit when Ra was 0.062 to 4.91 μm. A disconnection arose when Ra was 0.058 μm or smaller. A short circuit arose when Ra was 5.19 μm or larger. These results showed that a wire can be formed without either disconnection or short circuit within the upper and lower limits of Ra recited in the claims.

When the wire width is 150 μm, the upper limit of Ra in the claims is 7.5 μm. There was neither disconnection nor short circuit when Ra was 0.062 to 7.41 μm. A disconnection arose when Ra was 0.058 μm or smaller. A short circuit arose when Ra was 7.63 μm or larger. These results showed that a wire can be formed without either disconnection or short circuit within the upper and lower limits of Ra recited in the claims.

Thus, the present example showed that the range of the deviation Ra of the profile of the substrate within which wiring can be provided without disconnection or short circuit was not less than 60 nm and not more than $5 \times 10^{-2}$D, where D is the width of the wire.

Comparative Example 1

After the coarsening of the surface, substrates for wiring were prepared by the same procedure as in Example 1, except that the step of dipping in the 0.5% by weight solution of Compound 17 (with Fluorinert PF-5080 solvent from 3M Company) was not performed. When the substrates were provided with wiring and a continuity test was conducted, a short circuit was observed in all of the substrates, as shown in Table 3.

TABLE 3

Condition of wires formed on substrates with different deviation of profile.

| Ra (μm) | Contact angle with water (°) | Width of wire drawn (μm) | | | |
|---|---|---|---|---|---|
| | | 30 | 60 | 100 | 150 |
| 0.011 | 32 | S | S | S | S |
| 0.036 | 23 | S | S | S | S |
| 0.058 | 18 | S | S | S | S |
| 0.062 | 18 | S | S | S | S |
| 0.077 | 15 | S | S | S | S |
| 1.45 | <10 | S | S | S | S |
| 1.52 | <10 | S | S | S | S |
| 2.84 | <10 | S | S | S | S |
| 3.12 | <10 | S | S | S | S |
| 4.91 | <10 | S | S | S | S |
| 5.19 | <10 | S | S | S | S |
| 7.41 | <10 | S | S | S | S |
| 7.63 | <10 | S | S | S | S |

C: Disconnection exists.
S: Short circuit exists.
X: Neither disconnection nor short circuit exists.

Observation by an optical microscope showed the dispersion liquid used in drawing having spread in every one of the wires formed, thus indicating that the cause of short circuit was the dispersion liquid causing adjacent wires to come into contact with one another. Since the contact angle with respect to water was less than 110° in all of the cases, the lack of liquid repellence of the substrate is believed responsible for the short circuits.

Thus, the comparative example showed that a short circuit of wires is caused when the liquid repellency is insufficient (i.e., when the contact angle with water is less than 110°).

Example 2

After the coarsening of the surface, substrates for wiring were prepared by the same procedure as in Example 1 except that a 0.5% by weight solution of Compounds 18 to 28 (with Fluorinert PF-5080 solvent from 3M Company) was used instead of the 0.5% by weight solution of Compound 17 (with Fluorinert PF-5080 solvent from 3M Company).

The substrates were provided with wiring by the same method as in Example 1. In the present example, since the objective was to examine the difference in the condition of the wires formed due to different liquid repellent agents, the width of wires was limited to 60 μm. The results of the examination are shown in Table 4.

TABLE 4

Condition of wires formed on substrates with different deviation of profile when different liquid repellent agents were used

| Ra (μm) | Liquid repellent agent used (Compound) | | | | | | | | | | | |
|---|---|---|---|---|---|---|---|---|---|---|---|---|
| | 17 | 18 | 19 | 20 | 21 | 22 | 23 | 24 | 25 | 26 | 27 | 28 |
| 0.011 | C(112) | C(112) | C(115) | C(115) | S(88) | S(88) | S(92) | S(92) | C(111) | C(113) | C(111) | C(113) |
| 0.036 | C(126) | C(126) | C(128) | C(128) | S(92) | S(92) | S(96) | S(96) | C(123) | C(126) | C(123) | C(126) |
| 0.058 | C(136) | C(136) | C(138) | C(138) | S(99) | S(99) | S(103) | S(103) | C(130) | C(133) | C(130) | C(133) |
| 0.062 | X(138) | X(138) | X(140) | X(140) | S(100) | S(100) | S(104) | S(104) | X(131) | X(134) | X(131) | X(134) |
| 0.077 | X(146) | X(146) | X(148) | X(148) | S(101) | S(101) | S(105) | S(105) | X(140) | X(142) | X(140) | X(142) |
| 0.56 | X(>150) | X(>150) | X(>150) | X(>150) | X(>150) | X(>150) | X(>150) | X(>150) | X(>150) | X(>150) | X(>150) | X(>150) |
| 0.63 | X(>150) | X(>150) | X(>150) | X(>150) | X(>150) | X(>150) | X(>150) | X(>150) | X(>150) | X(>150) | X(>150) | X(>150) |
| 1.16 | X(>150) | X(>150) | X(>150) | X(>150) | X(>150) | X(>150) | X(>150) | X(>150) | X(>150) | X(>150) | X(>150) | X(>150) |
| 1.23 | X(>150) | X(>150) | X(>150) | X(>150) | X(>150) | X(>150) | X(>150) | X(>150) | X(>150) | X(>150) | X(>150) | X(>150) |
| 1.94 | X(>150) | X(>150) | X(>150) | X(>150) | X(>150) | X(>150) | X(>150) | X(>150) | X(>150) | X(>150) | X(>150) | X(>150) |
| 2.06 | S(>150) | S(>150) | S(>150) | S(>150) | S(>150) | S(>150) | S(>150) | S(>150) | S(>150) | S(>150) | S(>150) | S(>150) |
| 2.93 | S(>150) | S(>150) | S(>150) | S(>150) | S(>150) | S(>150) | S(>150) | S(>150) | S(>150) | S(>150) | S(>150) | S(>150) |
| 3.06 | S(>150) | S(>150) | S(>150) | S(>150) | S(>150) | S(>150) | S(>150) | S(>150) | S(>150) | S(>150) | S(>150) | S(>150) |
| 3.92 | S(>150) | S(>150) | S(>150) | S(>150) | S(>150) | S(>150) | S(>150) | S(>150) | S(>150) | S(>150) | S(>150) | S(>150) |
| 4.08 | S(>150) | S(>150) | S(>150) | S(>150) | S(>150) | S(>150) | S(>150) | S(>150) | S(>150) | S(>150) | S(>150) | S(>150) |

C: Disconnection exists.
S: Short circuit exists.
X: Neither disconnection nor short circuit exists.
The numbers in parentheses indicate contact angles (°) with respect to water.

The results for Compound 17 are also shown in Table 4.

The contact angle on the surface with any of the Ra values was not less than 110° when Compounds 17 to 20 and 25 to 28 were used. However, when Compounds 21 to 24 were used, short circuits were found in some cases even though Ra was not less than 60 nm and not more than $5 \times 10^{-2}$D, where D was the width of the wire. In these cases, the contact angle with water was less than 110°. The general tendency was that the contact angle was less than 110° when Ra was rather small in the aforementioned range of the deviation of profile. When the substrates with the contact angle of less than 110° were used, short circuits were observed, suggesting that they lacked sufficient liquid repellency. Compounds 17 to 20 are compounds that include a perfluoropolyether chain, and Compounds 25 to 28 are compounds that include a perfluoroalkyl chain, whereas Compounds 21 to 24 are compounds that include a fluoroalkyl chain. Thus, the present example showed that, when a wiring substrate is subjected to a liquid-repellent treatment, it is preferable to use a compound that includes a perfluoropolyether chain or a perfluoroalkyl chain as a liquid repellent agent that enables a sufficient liquid repellency to be provided even when Ra is small.

Example 3

The present example relates to the method of preparing a substrate using a highly liquid-repellent substrate (see FIG. 2B).

1. Preparation of a Substrate for Wiring

The surface of a substrate made of polytetrafluoroethylene-ethylene copolymer and measuring 100×50 mm and having a thickness of 1 mm was coarsened using a sandblasting apparatus (an integral sandblasting apparatus SFK-2 from Fuji Manufacturing Co., Ltd.). The polishing material used was of ceramic type (zirconia beads from Fuji Manufacturing Co., Ltd., with a particle size ranging from 75 to 106 μm). Surfaces with various Ra were formed by varying the time of blast, thereby producing the substrates for wiring.

Table 5 shows the Ra and contact angle of the substrate thus prepared.

TABLE 5

Condition of wires formed on substrates with different deviation of profile

| Ra (μm) | Contact angle with water (°) | Width of wire drawn (μm) | |
|---|---|---|---|
| | | 100 | 150 |
| 0.041 | 123 | C | C |
| 0.057 | 133 | C | C |
| 0.063 | 134 | X | X |
| 0.078 | 141 | X | X |
| 0.57 | >150 | X | X |
| 0.62 | >150 | X | X |
| 1.17 | >150 | X | X |
| 3.12 | >150 | X | X |
| 4.88 | >150 | X | X |
| 5.12 | >150 | S | X |
| 7.34 | >150 | S | X |
| 7.61 | >150 | S | S |

C: Disconnection exists.
S: Short circuit exists.
X: Neither disconnection or short circuit exists.

2. Wiring and Evaluation

Wiring and evaluation were conducted in the same way as in Example 1. The widths of the wires formed were 100 μm and 150 μm. The contact angle on the substrate surface with respect to water was not less than 110° in any of the substrates.

As a result, it was learned that, as in the case of Example 1, wires can be formed without disconnection or short circuit when Ra is not less than 60 nm and not more than $5 \times 10^{-2}$D, where D is the width of wire.

Thus, the present example and Example 1 showed that wires can be formed without disconnection or short circuit when the contact angle with respect to water is not less than 110° and Ra is not less than 60 nm and not more than $5 \times 10^{-2}$D, where D is the width of wire, even when the surface material for forming wires is different.

Example 4

In the present example, the method of preparing a substrate when wires are formed after the formation of a membrane, coarsening, and liquid-repellent treatment will be described (the method shown in FIG. 2C).

1. Preparation of a Substrate for Wiring

An epoxy resin (EP1004) manufactured by Yuka Shell Epoxy K.K. (44 parts by weight), a phenol resin (Marukalyncur M) manufactured by Maruzen Petrochemical K.K. (30 parts by weight), and a catalyst (TEA-K) manufactured by Hokko Kagaku K.K. (1 part by weight) were dissolved in ethylmethylketone (950 parts by weight), thereby preparing a paint for forming a resin coating.

The paint was then applied to a glass substrate measuring 100×50 mm and 1 mm in thickness by a dip coating method (with a dip time of 10 sec and a pulling rate of 10 mm/sec). After heating at 120° C. for 10 min, the substrate was further heated at 180° C. for 45 min, whereby the epoxy resin and the phenol resin copolymerized to form a resin coating on the glass substrate.

The resin coated surface was then coarsened with a sandblasting apparatus (an SFK-2 integral sandblasting apparatus from Fuji Manufacturing Co., Ltd.). The polishing material used was of ceramic type (zirconia beads from Fuji Manufacturing Co., Ltd., with a particle diameter ranging from 75 to 106 μm). Surfaces with different Ra were formed by varying the blasting time.

The thus coarsened resin-coated surfaces were irradiated with oxygen plasma, using Plasma Cleaner PDC-210 from Yamato Glass Company. The output power of the high-frequency power supply in the apparatus during irradiation was set for 100 W. Irradiation was carried out for 10 min, following which the substrate was promptly dipped in a 0.5% by weight solution of Compound 17 (with a Fluorinert PF-5080 solvent from 3M Company). The substrate was raised and then heated at 130° C. for 15 min, thereby obtaining the substrate for wiring.

Table 6 shows the Ra and contact angle with water of the thus prepared substrates.

TABLE 6

Condition of wires formed on substrates with different deviation of profile

| Ra (μm) | Contact angle with water (°) | Width of wire formed (μm) | |
|---|---|---|---|
| | | 100 | 150 |
| 0.042 | 126 | C | C |
| 0.057 | 134 | C | C |
| 0.062 | 136 | X | X |
| 0.096 | 144 | X | X |
| 1.17 | >150 | X | X |
| 3.33 | >150 | X | X |
| 4.78 | >150 | X | X |
| 5.28 | >150 | S | X |
| 7.36 | >150 | S | X |
| 7.68 | >150 | S | S |

C: Disconnection exists.
S: Short circuit exists.
X: Neither disconnection nor short circuit exists 2. Wiring and Evaluation Formation of wires and evaluation were carried out in the same manner as in Example 1. The widths of the wires formed were 100 μm and 150 μm. The contact angle on the substrate on the water was not less than 110° in any of the substrates.

As a result, it was learned that wires without disconnection or short circuit could be formed when Ra was not less than 60 nm and not more than $5 \times 10^{-2}$D, where D is the width of wire, as in Example 1.

The present example and Examples 1 and 3 showed that wires without disconnection or short circuit could be formed when the contact angle with respect to water was not less than 110° and when Ra was not less than 60 nm and not more than $5 \times 10^{-2}$D, where D is the width of wire, even when the surface material for forming the wires was different.

Comparative Example 2

After the coarsening of the surface, substrates for wiring were prepared by the same procedure as in Example 4 except that the oxygen plasma irradiation step and the step of dipping in the 0.5% by weight solution of Compound 17 (with a Fluorinert PF-5080 solvent from 3M Company) were not performed. After providing the substrates with wires, a continuity test was conducted, obtaining results showing that all of the substrates had a short circuit, as shown in Table 7

TABLE 7

Condition of wires on substrates with different deviation of profile

| Ra (μm) | Contact angle with water (°) | Width of wire formed (μm) | |
|---|---|---|---|
| | | 100 | 150 |
| 0.042 | 66 | S | S |
| 0.057 | 60 | S | S |
| 0.062 | 60 | S | S |
| 0.096 | 57 | S | S |
| 1.17 | 52 | S | S |
| 3.33 | 52 | S | S |
| 4.78 | 51 | S | S |
| 5.28 | 51 | S | S |
| 7.36 | 50 | S | S |
| 7.68 | 50 | S | S |

C: Disconnection exists.
S: Short circuit exists.
X: Neither disconnection nor short circuit exists In each of the wires formed, the dispersion liquid used in drawing had spread and come into contact with the adjacent wires, thereby causing a short circuit, which was observed with an optical microscope. The contact angle with water was less than 110° in each case, and it is believed that the lack of repellency on the substrate was responsible for the short circuit.

Thus, the present example also showed that a short circuit occurs in the wire when the liquid repellency is insufficient (i.e., when the contact angle with respect to water is less than 110°).

Example 5

The present example relates to the method of preparing a substrate whereby the wires are formed after the formation of the resin film and the liquid-repellent treatment (the method shown in FIG. 2D).

1. Preparation of a Substrate for Wiring

An epoxy resin (EP1004) manufactured by Yuka Shell Epoxy K.K. (44 parts by weight), a phenol resin (Marukalyncur M) manufactured by Maruzen Petrochemical K.K. (30 parts by weight), a catalyst (TEA-K) manufactured by Hokko Kagaku K.K. (1 part by weight), and a Homogenol L-95 microparticle dispersant manufactured by Kao Corporation were dissolved in ethylmethylketone (950 parts by weight). Thereafter, to provide the surface of the resin coating with pits and projections, Aerosil 130 (average particle diameter: 16 nm) manufactured by Nihon Aerosil K.K. (8 parts by weight) and Nipsil E-220A (average particle diameter: 1.5 μm) manufactured by Nippon Silica Industries K.K. (8 parts by weight) were added, and the mixture was stirred well. In this way, a paint for forming a resin coating having pits and projections was prepared.

Aerosil 130 and Nipsil E-220A are microparticles of silicon oxide.

Then, another paint for forming a resin coating having pits and projections was prepared in the same manner as described above except that the amount of Aerosil 130 and Nipsil E-220A each was 4 parts by weight, instead of 8 parts by weight.

Then, yet another paint for forming a resin coating having pits and projections was prepared in the same manner as described above except that the amount of Aerosil 130 and Nipsil E-220A each was 2 parts by weight, instead of 8 parts by weight.

The above three kinds of paints were each applied to a glass substrate measuring 100×50 mm and 1 mm in thickness by a dip coating method (with a dip time of 10 sec and a pulling rate of 10 mm/sec). The substrate was then heated at 120° C. for 10 min and further at 180° for 45 min, whereby the epoxy resin and the phenol resin copolymerized to form a resin coating on the glass substrate that had pits and projections.

The resin-coated surface was then irradiated with oxygen plasma, using Plasma Cleaner PDC-210 from Yamato Glass Company. The output power of the high-frequency power supply in the apparatus during irradiation was set for 100 W. Irradiation was carried out for 10 min. After irradiation, the substrate was promptly dipped in a 0.5% by weight solution of Compound 17 (with a Fluorinert PF-5080 solvent from 3M Company). The substrate was then raised and heated at 130° C. for 15 min, thereby preparing the substrate for wiring.

Table 8 shows the Ra and contact angle of the substrates prepared.

TABLE 8

Condition of wires on substrates with different deviation of profile

| Ra ($\mu$m) | Contact angle with water (°) | Width of wire formed ($\mu$m) | |
|---|---|---|---|
| | | 100 | 150 |
| 0.08 | 146 | X | X |
| 0.20 | >150 | X | X |
| 0.48 | >150 | X | X |

C: Disconnection exists.
S: Short circuit exists.
X: Neither disconnection nor short circuit exists.

Ra was 0.48 $\mu$m when the amount of Aerosil 130 and Nipsil E-220A each was 8 parts by weight, 0.20 $\mu$m when the amount was 4 parts by weight, and 0.08 $\mu$m when the amount was 2 parts by weight.

2. Wiring and Evaluation

Formation of wires and evaluation were conducted in the same manner as in Example 1. The widths of the wires formed were 100 $\mu$m and 150 $\mu$m. The contact angle on the surface of the substrate with respect to water was not less than 110° in each case. In the present example, Ra was not less than 60 nm and not more than $5 \times 10^{-2}$D, where D is the width of wire, in any of the substrates.

As a result of a continuity test, it was learned that wires without disconnection or short circuit could be formed in any of the substrates formed in accordance with the present example.

The present example and Examples 1, 3 and 4 showed that wires without disconnection or short circuit can be formed even when the surface material for forming wires is different as long as the contact angle with respect to water is not less than 110° and as long as Ra is in the range of not less than 60 nm and not more than $5 \times 10^{-2}$D, where D is the width of wire.

The present example also showed that, when forming a resin coating for forming wires, appropriate surface pits and projections can be formed upon film formation by simply adding microparticles of silicon oxide in the paint used. Namely, the present example has the advantage that the need for the surface coarsening step after film formation can be eliminated.

Example 6

The present example relates to the method of forming a substrate whereby wires are formed after film formation (see FIG. 2E).

1. Preparation of a Substrate for Wiring

An epoxy resin (EP1004) manufactured by Yuka Shell Epoxy K.K. (44 parts by weight), a phenol resin (Marukalyncur M) manufactured by Maruzen Petrochemical K.K. (30 parts by weight), and a catalyst (TEA-K) manufactured by Hokko Kagaku K.K. (1 part by weight) were dissolved in a mixture solvent of ethylmethylketone (950 parts by weight) and ethyleneglycolmono-n-butyletheracetate (50 parts by weight). Thereafter, Compound 1 (2 parts by weight) as a fluorine-containing compound was further added, and the mixture was well stirred. To provide the surface of the resin coating with pits and projections, Aerosil 130 (average particle diameter: 16 nm) manufactured by Nihon Aerosil K.K. (8 parts by weight) and Nipsil E-220A (average particle diameter: 1.5 $\mu$m) manufactured by Nippon Silica Industries K.K. (8 parts by weight) were added, and the mixture was stirred well. In this way, a paint for forming a resin coating having pits and projections and with a contact angle with water of not less than 110° was prepared.

Then, another paint for forming a resin coating having pits and projections and with a contact angle with water of not less than 110° was prepared in the same manner as described above except that the amount of Aerosil 130 and Nipsil E-220A each was 4 parts by weight, instead of 8 parts by weight.

Then, yet another paint for forming a resin coating having pits and projections and with a contact angle with water of not less than 110° was prepared in the same manner as described above except that the amount of Aerosil 130 and Nipsil E-220A each was 2 parts by weight, instead of 8 parts by weight.

The above three kinds of paints were each applied to a glass substrate measuring 100×50 mm and having a thickness of 1 mm by a dip coating method (with a dip time of 10 sec and a pulling rate of 10 mm/sec). The substrate was then heated at 120° C. for 10 min and further at 180° for 45 min, whereby the epoxy resin and the phenol resin copolymerized to form a resin coating on the glass substrate that had pits and projections and whose contact angle with water was not less than 110°. The glass substrate with the coating was provided with wires, as shown in Table 9.

TABLE 9

Condition of wires formed on substrates with different deviation of profile

| Ra ($\mu$m) | Contact angle with water (°) | Width of wire formed ($\mu$m) | |
|---|---|---|---|
| | | 100 | 150 |
| 0.09 | 136 | X | X |
| 0.21 | >150 | X | X |
| 0.46 | >150 | X | X |

C: Disconnection exists.
S: Short circuit exists.
X: Neither disconnection nor short circuit exists.

Ra was 0.46 $\mu$m when the amount of Aerosil 130 and Nipsil E-220A each was 8 parts by weight, 0.21 $\mu$m when the amount was 4 parts by weight, and 0.09 $\mu$m when the amount was 2 parts by weight.

2. Wiring and Evaluation

Formation of wires and evaluation were conducted in the same manner as in Example 1. The widths of the wires formed were 100 μm and 150 μm. The contact angle on the surface of the substrate with respect to water was not less than 110° in each case. In the present example, Ra was in the range of not less than 60 nm and not more than $5\times10^{-2}$D, where D is the width of wire, in any of the substrates.

As a result of a continuity test, it was learned that wires without disconnection or short circuit could be formed in any of the substrates formed in accordance with the present example.

The present example and Examples 1, 3, 4, and 5 showed that wires without disconnection or short circuit can be formed even when the surface material for forming wires is different as long as the contact angle with respect to water is not less than 110° and as long as Ra is in the range of not less than 60 nm and not more than $5\times10^{-2}$D, where D is the width of wire.

The present example also showed that, when forming a resin coating for forming wires, appropriate surface pits and projections can be formed and liquid repellency can be obtained upon film formation by simply adding microparticles of silicon oxide and an appropriate liquid repellent agent in the paint used. Namely, the present example has the advantage that the need for the surface coarsening step and the liquid-repellent treatment step after film formation can be eliminated.

Example 7

Substrates for wiring were formed by the same procedure as in Example 6 except that Compounds 2 to 11 were used instead of Compound 1 (2 parts by weight).

The substrates were provided with wires in the same manner as in Example 1. Since the objective of the present example was to examine whether or not there was any difference due to difference in the liquid repellent material, the width of the wire was limited to 100 μm. The results of the examination are shown in Table 10.

Ra was in the range of not less than 60 nm and not more than $5\times10^{-2}$D, where D is the width of wire.

Thus, the present example and Examples 1, 3, 4, 5, and 6 showed that wires without disconnection or short circuit can be formed even if the surface material for forming wires (i.e., the liquid repellent material in the present example) is different as long as the contact angle with respect to water is not less than 110° and as long as Ra is in the range of not less than 60 nm and not more than $5\times10^{-2}$D, where D is the width of wire.

The present example as well as Example 6 showed that, when preparing a resin film for forming wires, appropriate surface pits and projections can be formed and liquid repellency can be obtained upon film formation by simply adding microparticles of silicon oxide and an appropriate liquid repellent material in the paint used. Namely, the examples had the advantage that the need for the surface coarsening step and the liquid repellent treatment after film formation can be eliminated.

Example 8

A resin coating was formed in the same manner as in Example 6 using the paint (in which 8 parts by weight of Aerosil 130 and Nipsil E-220A each were added) that had been prepared in Example 6 for preparing a substrate for wiring. Then, wires with a width of 100 μm were formed. Ra on the substrate surface was 0.46 μm and the contact angle with respect to water was not less than 150°.

Thereafter, using the aforementioned paint, a resin coating was formed on the substrate following the formation of the wires, and then an operation was further carried out to form wires with a width of 100 μm. As a result, two layers of wiring patterns were formed. This operation will be referred to as a lamination step.

After the lamination step, Ra and the contact angle with respect to water on the surface were measured, and further a continuity test was conducted. The results showed that Ra was 0.46 μm and the contact angle with water was not less than 150°, and that there was neither disconnection nor short circuit.

TABLE 10

Condition of wires formed on substrate with different deviation of profile when different liquid repellent agents were used

| Ra | Liquid repellent agent used (Compound) | | | | | | | | | | |
|---|---|---|---|---|---|---|---|---|---|---|---|
| (μm) | 1 | 2 | 3 | 4 | 5 | 6 | 7 | 8 | 9 | 10 | 11 |
| 0.08 to 0.09 | X(136) | X(140) | X(133) | X(138) | X(138) | X(142) | X(130) | X(135) | X(129) | X(132) | X(128) |
| 0.19 to 0.21 | X(>150) | X(>150) | X(>150) | X(>150) | X(>150) | X(>150) | X(>145) | X(>147) | X(>142) | X(>144) | X(>140) |
| 0.46 to 0.48 | X(>150) | X(>150) | X(>150) | X(>150) | X(>150) | X(>150) | X(>150) | X(>150) | X(>150) | X(>150) | X(>150) |

C: Disconnection exists.
S: Short circuit exists.
X: Neither disconnection nor short circuit exists.
Numerals in parentheses are contact angles with respect to water (°).

In Table 10, the results of Compound 1 are also shown. Ra on the surface with the coating prepared using Compounds 1 to 11 was substantially equal for the different compounds used. Specifically, Ra was between 0.46 and 0.48 μm when the amount of Aerosil 130 and Nipsil E-220A each was 8 parts by weight, between 0.19 and 0.21 μm when the amount was 4 parts by weight, and between 0.08 and 0.09 μm when the amount was 2 parts by weight.

Since neither disconnection nor short circuit was observed in any of the wires prepared in accordance with the present example, it is believed that excellent wires were formed.

When Compounds 1 to 11 were used, the contact angle on the surface was not less than 110° for any of the Ra values, and After an additional lamination step, Ra and the contact angle with respect to water on the surface were measured, and further a continuity test was conducted. The results showed that Ra was 0.47 μm and the contact angle with water was not less than 150°, and that there was neither disconnection nor short circuit.

In order to enable the formation of wires in a plurality of layers, it is necessary that at least the wiring surface of the second and subsequent layers from the bottom be coated.

By thus using a paint when preparing a substrate for forming wires as described above, wiring can be provided in a plurality of layers. This means that more wires can be formed in a limited area. The method of the present example thus enables greater integration of wires in a unit area.

Example 9

Figure 3:
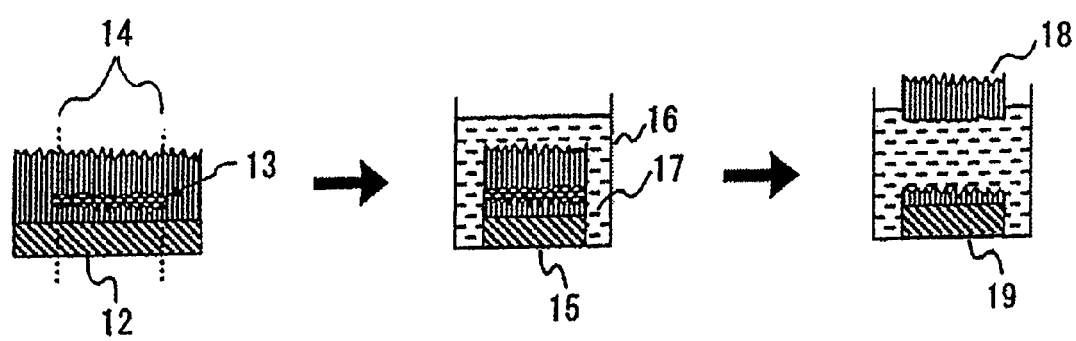
FIG. 3 schematically shows a method of preparing a sample for determining the condition of the surface of a wire-formed portion.

In order to examine the condition of the surface of the lower-most layer (where the wires are formed first) of the wiring substrate prepared in Example 8, a measurement sample was prepared by the method shown in FIG. 3.

A wire-formed portion 13 in the lower-most layer of the wiring substrate 12 was cut out vertically with respect to the substrate, as shown in FIG. 3. The dotted line indicates cut portions 14. For the cutting, Isomet Low-Speed Saw from Buehler Ltd. was employed. A substrate 15 that was cut out was then put in a polypropylene container 16, in which such an amount of a 10% solution of nitric acid 17 was put in that the substrate was completely immersed. The substrate was kept immersed for a whole day. As a result, the silver in the wires dissolved in nitric acid, so that a portion 18 other than the lower-most layer peeled off, thereby obtaining a sample 19 in which the lower-most layer was exposed. After the sample was raised from the nitric acid, washed with water and dried, the contact angle with respect to water and Ra were measured. For the measurement of the contact angle, Microscopic Automatic Contact Angle Meter MCA-1 from Kyowa Interface Science Co., Ltd was used. As a result, Ra on the surface of the lower-most layer was 0.46 µm, and the contact angle with respect to water was not less than 150°, which corresponded to the results of Example 6.

Thus, it was confirmed that, at the wire-formed portion of the wiring substrate too, the contact angle was not less than 110° and Ra was in the range of not less than 60 nm and not more than $5 \times 10^{-2} D$, where D is the width of wire.

What is claimed is:

1. A method of manufacturing a wiring substrate comprising a substrate, an organic membrane formed on said substrate, and a metal wire formed on said organic membrane, said method comprising the steps of:
   forming said organic membrane on said substrate, said organic membrane being provided with a surface having pits and projections with an arithmetic mean deviation of profile of not less than 60 nm and not more than $5 \times 10^{-2} D$, where D is the width of said metal wire, and with a contact angle with respect to water of not less than 110°, wherein D is not less than 30 µm and not more than 150 µm;
   applying a dispersion liquid containing metal microparticles to said organic membrane so that said dispersion liquid containing metal microparticles permeates at least some of said pits and projections; and
   heating the dispersion liquid that has been applied.

2. The method according to claim 1, wherein said organic membrane comprises a mixture of a polyimide resin and a compound including a perfluoropolyether chain or a perfluoroalkyl chain.

3. The method according to claim 1, wherein said organic membrane comprises a mixture of a resin and silicon-oxide microparticles.

4. The method according to claim 1, wherein said organic membrane comprises a compound including a perfluoropolyether chain or a perfluoroalkyl chain.

5. The method according to claim 1, wherein said organic membrane comprises a mixture of a resin, silicon-oxide microparticles, and a fluorine-containing compound having the following structure:

Rf(R)z where Rf has the following structure:

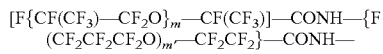

or

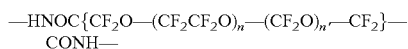

where m, m', n, and n' are natural numbers; and
where R has the following structure:

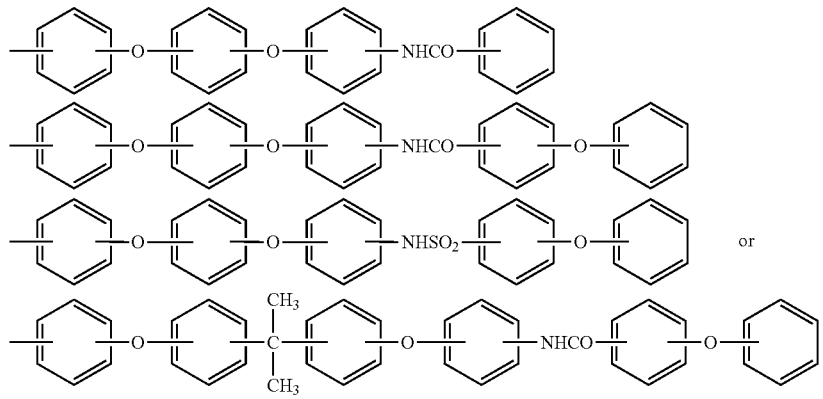

where z is 1 or 2.

6. The method according to claim 1, further comprising chemically bonding a fluorine-containing compound to the surface of said organic membrane, said fluorine-containing compound including an alkoxysilane structure at the terminal thereof.

7. The method according to claim 6, wherein said alkoxysilane structure is selected from the group consisting of:

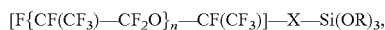

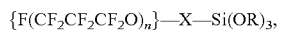

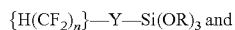

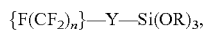

where X is a binding site of a perfluoropolyether chain and an alkoxysilane residue, Y is a binding site of a perfluoroalkyl chain and an alkoxysilane residue, and R is an alkyl group.

8. The method according to claim 1, wherein said organic membrane is provided with the arithmetic mean deviation of profile of not less than 60 nm and not more than $5 \times 10^{-2} D$ by spraying the surface of said organic membrane with microparticles of an abrasive material.

9. The method according to claim 1, wherein said organic membrane is provided with the arithmetic mean deviation of profile of not less than 60 nm and not more than $5 \times 10^{-2}$D by rubbing the surface of said organic membrane with sandpaper.

10. A method of manufacturing a wiring substrate comprising a substrate, and a metal wire formed on said substrate, said method comprising the steps of:
providing said substrate having a surface having pits and projections with an arithmetic mean deviation of profile of not less than 60 nm and not more than $5 \times 10^{-2}$D, where D is the width of said metal wire, and with a contact angle with respect to water of not less than 110°, wherein D is not less than 30 μm and not more than 150 μm;
applying a dispersion liquid containing metal microparticles to said substrate so that said dispersion liquid containing metal microparticles permeates at least some of said pits and projections; and
heating the dispersion liquid that has been applied.

11. The method according to claim 10, wherein said substrate comprises polytetrafluoroethylene.

12. The method according to claim 10, further comprising chemically bonding a fluorine-containing compound to the surface of said substrate, said fluorine-containing compound having an alkoxysilane structure at the terminal thereof.

13. The method according to claim 12, wherein said alkoxysilane structure is selected from the group consisting of:

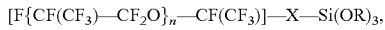

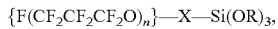

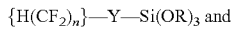

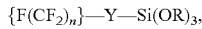

where X is a binding site of a perfluoropolyether chain and an alkoxysilane residue, Y is a binding site of a perfluoroalkyl chain and an alkoxysilane residue, and R is an alkyl group.

14. The method according to claim 10, wherein said substrate is provided with the arithmetic mean deviation of profile of not less than 60 nm and not more than $5 \times 10^{-2}$D by spraying the surface of said substrate with microparticles of an abrasive material.

15. The method according to claim 10, wherein said substrate is provided with the arithmetic mean deviation of profile of not less than 60 nm and not more than $5 \times 10^{-2}$D by rubbing the surface of said substrate with sandpaper.

16. The method according to claim 10, wherein the step of applying said dispersion liquid containing metal microparticles comprises drawing said dispersion liquid containing metal microparticles in a predetermined pattern, and the step of heating the dispersion liquid that has been applied causes the metal microparticles to fuse and bind together to form said metal wire with said width D.

17. The method according to claim 10, wherein said surface of said substrate has a contact angle with respect to water of 110°-180°.

18. The method according to claim 1, wherein the step of applying said dispersion liquid containing metal microparticles comprises drawing said dispersion liquid containing metal microparticles in a predetermined pattern, and the step of heating the dispersion liquid that has been applied causes the metal microparticles to fuse and bind together to form said metal wire with said width D.

19. The method according to claim 1, wherein said surface of said organic membrane has a contact angle with respect to water of 110°-180°.

20. The method according to claim 1, wherein said organic membrane is provided with said surface having pits and projections when the organic membrane is formed on said substrate by including microparticles with a specific gravity of not more than 4 in said organic membrane.

* * * * *